United States Patent
Kamikawa et al.

(12) 
(10) Patent No.: US 6,628,249 B1
(45) Date of Patent: Sep. 30, 2003

(54) LIGHT EMITTING APPARATUS, METHOD FOR DRIVING THE LIGHT EMITTING APPARATUS, AND DISPLAY APPARATUS INCLUDING THE LIGHT EMITTING APPARATUS

(75) Inventors: Takeshi Kamikawa, Nara (JP); Shigetoshi Ito, Ikoma (JP); Mototaka Taneya, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 141 days.

(21) Appl. No.: 09/711,353

(22) Filed: Nov. 9, 2000

(30) Foreign Application Priority Data

Nov. 12, 1999 (JP) ............................................ 11-322044

(51) Int. Cl.$^7$ ................................................. G09G 3/06
(52) U.S. Cl. ............................ 345/44; 345/46; 345/82; 345/83; 257/86; 250/552
(58) Field of Search ............................... 345/39, 44, 46, 345/82, 83, 204, 690, 691; 257/79, 86, 103; 250/552

(56) References Cited

U.S. PATENT DOCUMENTS

| | | | | |
|---|---|---|---|---|
| 5,825,052 A | * | 10/1998 | Shakuda ........................ | 257/94 |
| 5,998,925 A | * | 12/1999 | Shimizu et al. ............... | 313/503 |
| 6,288,696 B1 | * | 9/2001 | Holloman ...................... | 345/84 |
| 6,329,764 B1 | * | 12/2001 | van de Ven .................. | 315/291 |
| 2002/0041148 A1 | * | 4/2002 | Cho et al. ..................... | 313/499 |

FOREIGN PATENT DOCUMENTS

JP          5-029657          2/1993

* cited by examiner

Primary Examiner—Kent Chang
Assistant Examiner—Tom Sheng
(74) Attorney, Agent, or Firm—Morrison & Foerster LLP

(57) ABSTRACT

A light emitting apparatus comprises a light emitting section for emitting light, a color of the light being changed with a value of a driving current, and a driving section for driving the light emitting section so that the light emitting section emits light having a desired color and a desired intensity, by generating the driving current based on a signal designating the desired color and a signal designating the desired intensity and by applying the driving current to the light emitting section.

22 Claims, 20 Drawing Sheets

LIGHT EMITTING APPARATUS, METHOD FOR DRIVING THE LIGHT EMITTING APPARATUS, AND DISPLAY APPARATUS INCLUDING THE LIGHT EMITTING APPARATUS

BACKGROUND OF THE INVENTION

1. Field of the Invention

The present invention relates to a light emitting apparatus and a method for driving the light emitting LED apparatus. The present invention also relates to a display apparatus including the light emitting apparatus.

2. Description of the Related Art

FIG. 20 illustrates a conventional LED driving apparatus. In the conventional LED driving apparatus, a driving current i corresponding to an output establishment value p is applied from a power source 191 to an LED device 192 to drive the LED device 192. The emission intensity of the LED device 192 is controlled by changing the value of the driving current i. In general, the color of light emitted from conventional LED devices does not depend on the value of a driving current. Thus, the emission intensity, of conventional LED devices is changed by control of the driving current value while maintaining the color of light emitted from the LED devices.

The emission intensity of conventional LED devices can be solely changed by control of the driving current value, since the light color of the conventional LED devices is not affected by a change in the driving current value. However, there is another type of LED device having a light color which is altered by a change in the driving current value. When such an LED device is driven by a driving apparatus as shown in FIG. 20, the light color of the LED device is changed along with the emission intensity control thereof. Thus, a desired emission intensity control cannot be conducted.

Conventional AlGaAs semiconductor light emitting devices have a phenomenon In which the wavelength of light emitted therefrom becomes longer as a driving current is Increased (red shift phenomenon). The red shift phenomenon occurs as follows. The light emitting device is heated by supplied power, and the temperature of the device is proportional to the average supplied power. The increased temperature causes the bandgap of the active layer to be reduced, so that the wavelength of light emitted from the device becomes longer (red shift). In other words, the emission intensity and emission wavelength of the light emitting device having the red shift phenomenon are determined by the average power applied to the device. It is not possible to separately control the emission wavelength and emission power of the AlGaAs semiconductor light emitting device using two parameters (peak value and average power) of a driving current pulse.

SUMMARY OF THE INVENTION

According to one aspect of the present invention, a light emitting apparatus comprises: a light emitting section for emitting light, a color of the light being blue shifted with a value of a driving current; and a driving section for driving the light emitting section so that the light emitting section emits light having a desired color and a desired intensity, by generating the driving current based on a signal designating the desired color and a signal designating the desired intensity and by applying the driving current to the light emitting section.

In one embodiment of this invention, the driving section comprises: a converting section for converting the color-designating signal to a signal designating a current value in accordance with current versus emission wavelength characteristics of the light emitting section: a calculating section for calculating a signal designating a duty based on the intensity-designating signal and the current value-designating signal, in such a manner that the product of a current value designated by the current value-designating signal and u duty corresponds to the intensity designated by the intensity-designating signal; and e section for generating, as the driving current, a pulse current having the current value and the duty In accordance with the respective current value-designating signal and duty-designating signal.

In one embodiment of this invention, the light emitting section is an LED device.

In one embodiment of this invention, the light emitting section is an LED bullet comprising: an LED device; and a fluorescent excited by light emitted by the LED device to emit light.

In one embodiment of this invention, when the driving current value is changed, a change in an emission wavelength of the LED bullet is larger than a change in an emission wavelength of the LED device.

In one embodiment of this invention, the light emitting apparatus comprises a plurality of the light emitting sections: and a plurality of the driving sections respectively corresponding to the plurality of the light emitting sections. A color and intensity of light emitted by each of the plurality of the light emitting sections is controlled by a corresponding one of the plurality of the driving sections.

In one embodiment of this invention, the color-designating signal is a color signal for designating a color of light to be emitted by the LED device, and the intensity-designating signal is an intensity signal for-designating an intensity of the light to be emitted by the LED device.

In one embodiment of this invention, the color-designating signal is a chromaticity signal for designating a color of light to be emitted by the LED bullet, and the intensity-designating signal is a luminance signal for designating an intensity of the light to be emitted by the LED bullet.

In one embodiment of this Invention, the LED device comprises: an InGaN active layer and an AlGaN layer having two layers, provided on the InGaN active layer. One of the two layers is a first AlGaN layer contacting the InGaN active layer, and the other of the two layers of the AlGaN layer is a second AlGaN layer provided on the first AlGaN layer, the first AlGaN layer is produced at substantially the same growth temperature as the InGaN active layer, and the second AlGaN layer is produced at a growth temperature higher than the growth temperature of the first AlGaN layer.

In one embodiment of this invention, the LED device comprises: an InGaN active layer; and an AlGaN layer having two layers, provided on the InGaN active layer. One of the two layers is a first AlGaN layer contacting the InGaN active layer, and the other of the two layers of the AlGaN layer is a second AlGaN layer provided on the first AlGaN layer, the first AlGaN layer is produced at substantially the same growth temperature as the InGaN active layer, and the second AlGaN layer is produced at a growth temperature higher than the growth temperature of the first AlGaN layer.

According to another aspect of the present invention, a method for driving a light emitting apparatus is provided. The apparatus comprises: a light emitting section for emitting light, a color of the light being blue shifted with a value of a driving current; and a driving section for driving the light emitting section. The method comprises the steps of: receiving a signal designating a desired color and a signal designating a desired intensity; generating the driving current based on the color-designating signal and the intensity-designating signal; and applying the driving current to the light emitting section so that the light emitting section emits light having the desired color and the desired intensity.

In one embodiment of this invention, the method further comprises the steps of: converting the color-designating signal to a signal designating a current value in accordance-with current versus emission wavelength characteristics of the light emitting section; calculating a signal designating a duty based on the intensity-designating signal and the current-value-designating signal, in such a manner that the product of a current value designated by the current value-designating signal and the duty corresponds to the intensity designated by the intensity-designating signal; and generating as the driving current a pulse current having the current value and the duty in accordance with the respective current value-designating signal and duty-designating signal.

In one embodiment of this invention, the light emitting section is an LED device.

In one embodiment of this invention, the light emitting section is an LED bullet comprising an LED device; and a fluorescent excited by light emitted by the LED device to emit light.

In one embodiment of this invention, when the driving current value is changed, a change in an emission wavelength of the LED bullet is larger than a change in an emission wavelength of the LED device.

In one embodiment of this invention, the light emitting apparatus comprises: a plurality of the light emitting sections; and a plurality of the driving sections respectively corresponding to the plurality of the light emitting sections. A color and intensity of light emitted by each of the plurality of the light emitting sections is controlled by a corresponding one of the plurality of the driving sections.

In one embodiment of this Invention, the color-designating signal is a color signal for designating a color of light to be emitted by the LED device, and the intensity-designating signal is an intensity signal for designating an Intensity of the light to be emitted by the LED device.

In one embodiment of this invention, the color-designating signal is a chromaticity signal for designating a color of light to be emitted by the LED bullet, and the intensity-designating signal is a luminance signal for designating an intensity of the light to be emitted by the LED bullet.

In one embodiment of this invention, the LED device comprises: an InGaN active layer; and an AlGaN layer having two layers, provided on the InGaN active layer. One of the two layers is a first AlGaN layer contacting the InGaN active layer, and the other of the two layers of the AlGaN layer is a second AlGaN layer provided on the first AlGaN layer, the first AlGaN layer is produced at substantially the same growth temperature as the InGaN active layer, and the second AlGaN layer is produced at a growth temperature higher than the growth temperature of the first AlGaN layer.

In one embodiment of this invention, the LED device comprises: an InGaN active layer; and an AlGaN layer having two layers, provided on the InGaN active layer. One of the two layers is a first AlGaN layer contacting the InGaN active layer, and the other of the two layers of the AlGaN layer is a second AlGaN layer provided on the first AlGaN layer, the first AlGaN layer is produced at substantially the same growth temperature as the InGaN active layer, and the second AlGaN layer is produced at a growth temperature higher than the growth temperature of the first AlGaN layer.

In one embodiment of this invention, the light emitting section is an LED device, the LED device is driven by a pulse current having a current value and a duty, the current value is set to a value corresponding to an emission wavelength of the LED device, and the duty is set to a value corresponding to an emission intensity of the LED device.

In one embodiment of this invention, the current value is set to a value In a range in which a change In the emission wavelength of the LED device is about 6 nm, and the duty is changed in accordance with the emission intensity of the LED device.

In one embodiment of this invention, the current value is controlled so that the emission wavelength of the LED device is changed, and the duty is controlled so that the emission intensity of the LED device is substantially maintained constant.

In one embodiment of this invention, the light emitting section is an LED bullet comprises: an LED device; and a fluorescent excited by light emitted by the LED device to emit light. An emission wavelength of the LED device is changed by changing the driving current value so that a color of light emitted by the LED bullet is changed.

In one embodiment of this invention, the light emitting section is an LED bullet comprises: an LED device; and a fluorescent excited by light emitted by the LED device to emit light. The LED device is driven by a pulse current having a current value and a duty wherein the current value is set to a value In accordance with current versus emission wavelength characteristics of the LED bullet, and the duty is set to a value in accordance with emission intensity characteristics of the LED bullet.

According to another aspect of the present invention, a display apparatus comprises: a plurality of light emitting sections provided in a plane, light emitted by each of the plurality of light emitting sections being blue shifted with a value of a driving current; and a plurality of driving sections each for driving a corresponding one of the plurality of light emitting sections so that the corresponding one of the plurality of light emitting sections emits light having a desired color and a desired intensity, by each generating the driving current based on a signal designating the desired color and a signal designating the desired intensity and by each applying the driving current to the corresponding one of the plurality of light emitting sections.

In one embodiment of this invention, each of the plurality of light emitting-sections is an LED device.

In one embodiment of this Invention, each of the plurality of light emitting sections is an LED bullet comprising: an LED device; and a fluorescent excited by light emitted by the LED device to emit light.

According to another aspect of the present invention, an LED bullet comprises: an LED device having a light color, the light color being blue shifted with a change in a driving current; and a fluorescent excited by light emitted by the LED device to emit light.

Thus, the invention described herein makes possible the advantages of providing (1) a method for driving an LED device having a light color which is blue shifted with a driving current value, In such a manner that the emission intensity of the LED device is changed while maintaining the light color of the LED device from being changed; (2) a method for driving an LED device in which variation of the emission intensity and light color of the LED device can be suppressed; (3) a method for driving an LED device in which light emitted from the LED device can be changed by utilizing a characteristic of the LED device in which the light color of the LED device is changed with a current driving value; (4) an apparatus for achieving the above-described methods; (5) an LED bullet including an LED device and a fluorescent and capable of providing a wide range of variations in light color; and (6) a method for driving the LED bullet.

These and other advantages of the present invention will become apparent to those skilled in the art upon reading and understanding the following detailed description with reference to the accompanying figures.

DESCRIPTION OF THE PREFERRED EMBODIMENTS

Figure 1:
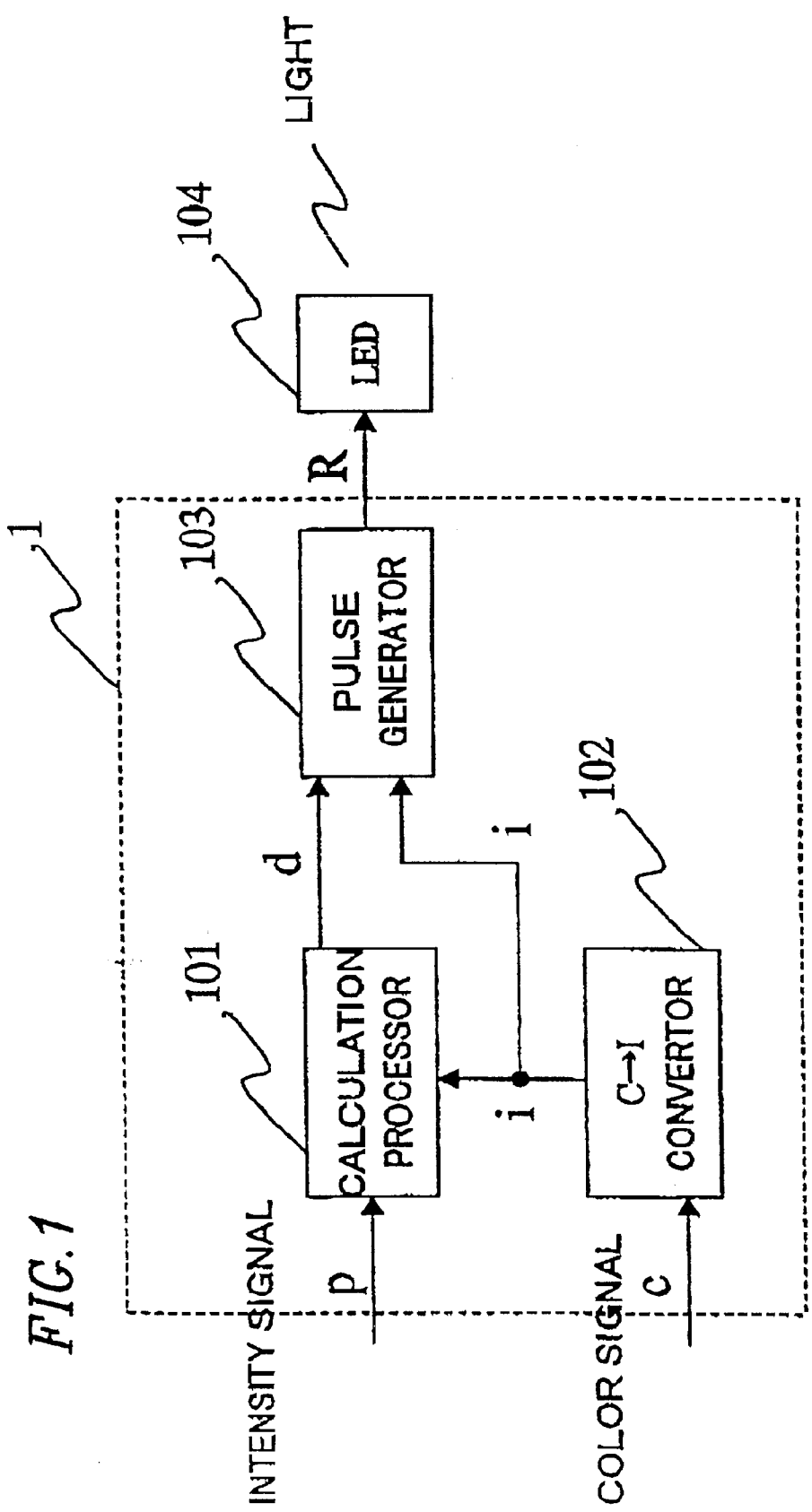
FIG. 1 is a schematic diagram illustrating an LED apparatus according to Example 1 of the present invention.

Hereinafter, the present invention will be described by way of illustrative examples with reference to the accompanying drawings.

The present invention provides a method for controlling an LED device having an active layer which is an InGaN quantum well layer and an emission wavelength which in blue shifted (becomes shorter). In the method of the present invention, the emission power and emission wavelength of the LED device can be tuned to desired values by employing a pulse driving system. The inventors have focused on the fact that the blue shift in the LED device is determined depending on the instantaneous amount of carriers in the active layer of the LED device. The emission wavelength of the LED device is controlled using the peak value of a pulse driving current. In the meantime, the emission intensity of the LED device is controlled using the average power of the pulse driving current. Therefore, the pulse duration of the pulse driving current is preferably as long as or longer than the recombination life span of a carrier in the active layer of the LED device. This is because when the pulse duration is shorter than the recombination life span of a carrier In the active layer, the effective carrier density of the active layer is a value obtained by calculating the integral of carriers over the recombination life span of a carrier, so that the carrier amount of the active layer does not depend directly on the peak value of each pulse. In general, the recombination life span of a carrier in an LED device having the blue shift phenomenon of which an active layer is made of InGaN is about 0.2 ns or more. The pulse duration of each pulse in the driving current is preferably about 0.2 ns or more, more preferably about 1 ns or more.

A major problem with the above-described blue shift is that the color tone of light emitted from the LED device is visually changed. The object of the present invention is to drive an LED device, where the tone of the emission intensity of the LED device is modulated by simply changing a current amount, under conditions given by:

$$\lambda_1 - \lambda_2 \geq 6 \text{ nm and } I_1 < I_2$$

where in the range from the minimum current value or more to the maximum current value or less, $\lambda_1$ is the longest emission wavelength and $I_1$ is the current value when the longest emission wavelength is obtained, and $\lambda_2$, is the shortest emission wavelength and $I_2$ is the current value when the shortest emission wavelength is obtained.

For example, the present invention is applied to the case where the difference in emission wavelength between when the LED device is driven by a direct current of about 0.1 mA and when the LED device is driven by a direct current of about 30 mA is about 6 nm or more. Conversely, when the LED device is controlled so that wavelength shift is restricted to a predetermined level, the LED apparatus should be designed so that the wavelength shift falls within the range of about 6 nm or less.

EXAMPLE 1

A light emitting apparatus according to Example 1 of the present invention Includes: a light emitting section for emitting light in which a color of the light is blue shifted with a value of a driving current; and a driving section for driving the light emitting section so that the light emitting section emits light having a desired color and a desired intensity, by generating the driving current based on a signal designating the desired color and a signal designating the desired intensity and by applying the driving current to the light emitting section. In description of Example 1, the light emitting section serves as an LED device, and the driving section serves as an LED on-off circuit.

FIG. 1 illustrates an LED apparatus according to Example 1 of the present invention. The LED apparatus of Example 1 includes an LED on-off circuit 1 for outputting an LED driving current R based on an intensity signal p and a color signal c, and an LED device 104 having a light color which is changed with a change in a driving current value.

The LED on-off circuit 1 includes: a color signal-current value signal converter 102 for converting the color signal c to a current value signal i; a calculation processor 101 for calculating and outputting a duty signal d designating a duty D, based on an intensity signal p and the current value signal i; and a square wave pulse generator 103 for outputting a square wave pulse current R as the LED driving current based on the current value signal i and the duty signal d.

Figure 2:
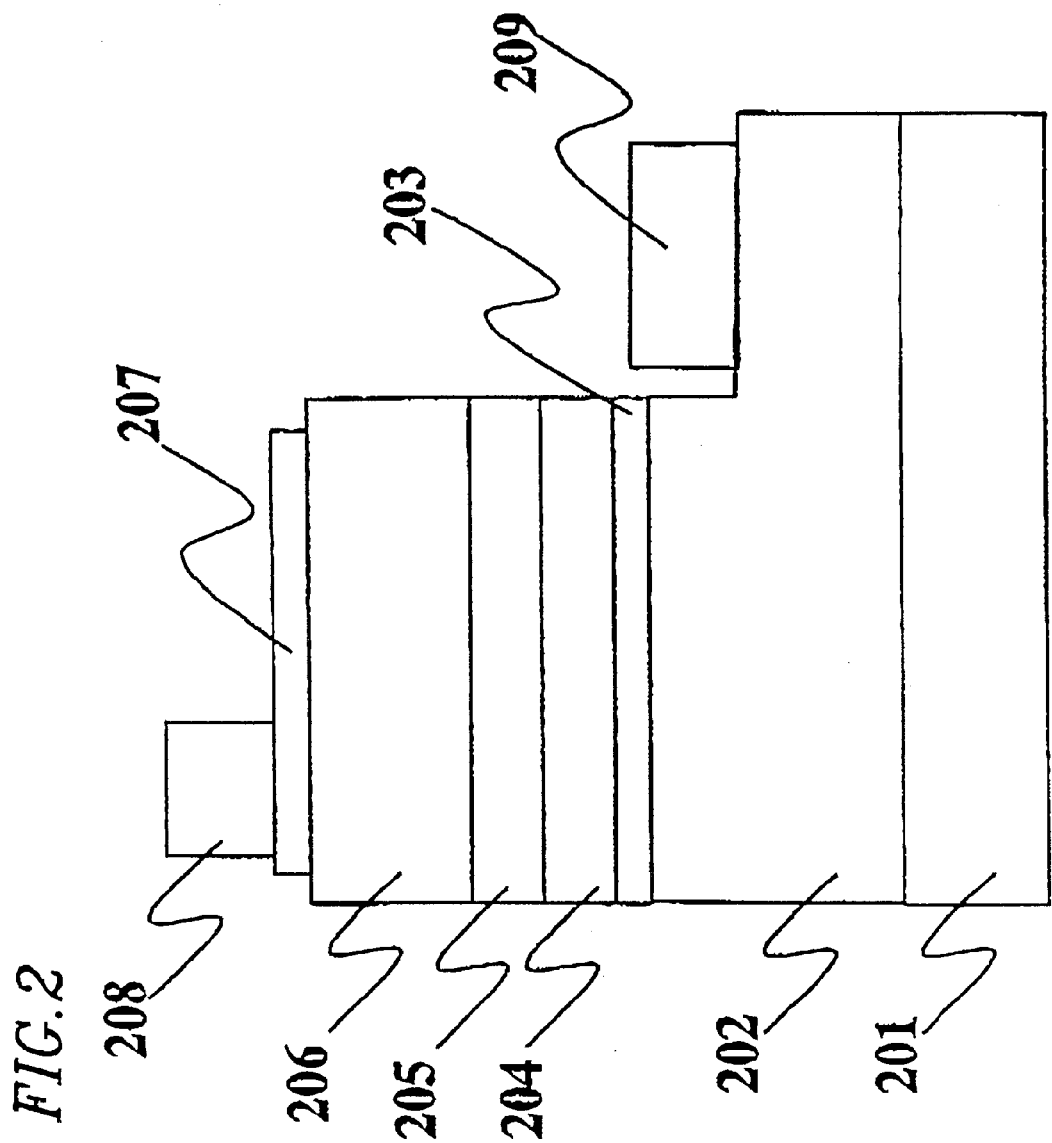
FIG. 2 a schematic diagram illustrating a configuration of an LED device according to Example 1 of the present invention.

FIG. 2 is a cross-sectional view illustrating a structure of the LED device 104 of Example 1. The LED device 104 is fabricated in the following way. A GaN buffer layer (not shown), an n-type GaN layer 202, an $In_{0.2}Ga_{0.8}N$ active layer 203, a p-type $Al_{0.1}Ga_{0.9}N$ evaporation prevention layer 204, a p-type $Al_{0.1}Ga_{0.9}N$ upper evaporation prevention layer 205, and a p-type GaN contact layer 206 are successively formed on a sapphire substrate 201. The resulting multi-layer structure is dry-etched by reactive ion beam etching (RIBE) until a portion of the n-type GaN layer 202 is exposed. A nickel (Ni) film 207 is formed and patterned on part of the p-type contact layer 206.

A gold (Au) electrode pad 208 is formed on the Ni film 207. Thereafter, a titanium (Ti) film is formed on part of the exposed surface of the n-type GaN layer 202 and an aluminum (Al) film is formed on the Ti film to provide an n-side electrode 209.

The above-described fabrication process of the LED device 104 will be described below in more detail. The sapphire substrate 201 is heated at a temperature of about 1050° C. in an atmosphere of $H_2$ using an MOCVD apparatus for the purpose of subjecting the sapphire substrate 201 to surface treatment. Thereafter, the temperature of the substrate 201 is decreased to about 500° C. to form the GaN buffer layer (not shown). In this case, the thickness of the buffer layer is about 250 Å, for example. The substrate temperature is increased to about 1020° C. and the n-type GaN layer 202 having a thickness of about 4 μm is grown on the GaN buffer layer. The substrate temperature to decreased to about 720° C. and the non-doped or Si-doped $In_{0.2}Ga_{0.8}N$ active layer 203 having a thickness of about 30 Å is grown on the n-type GaN layer 202. Thereafter, the p-type $Al_{0.1}Ga_{0.9}N$ evaporation prevention layer 204 having a thickness of about 100 Å is grown on the $In_{0.2}Ga_{0.8}N$ active layer 203 at the same temperature (i.e., about 720° C.). The substrate temperature is increased to about 900° C. and the p-type $Al_{0.1}Ga_{0.9}N$ upper evaporation prevention layer 205 having a thickness of about 100 Å is grown on the p-type $Al_{0.1}Ga_{0.9}N$ evaporation prevention layer 204. The growth temperature is preferably equal to, but actually is allowed to fall within a tolerable range of about plus or minus 50° C. from, the temperature at which the $In_{0.2}Ga_{0.8}N$ active layer 203 has been grown. Thereafter, the substrate temperature-is increased to about 1000° C. and the p-type GaN contact layer 206 having a thickness of about 3000 Å is grown on the p-type $Al_{0.1}Ga_{0.9}N$ upper evaporation prevention layer 205.

A resist is applied on the p-type GaN contact layer 206 followed by patterning using a photolithography technique. Part of the resultant multi-layer structure is dry-etched so that a portion of the n-type GaN layer 202 is exposed. The n-type electrode 209 is formed on part of the exposed surface of the n-type GaN layer 202. After removal of the resist, the nickel (Ni) metal film 207 having a thickness of about 30 Å to about 100 Å is deposited on part of the p-type GaN contact layer 206 by patterning using a photolithography technique. The gold (Au) pad electrode 208 having a thickness of about 4000 Å is provided in a way similar to that used when the metal film 207 is provided.

Figure 3:
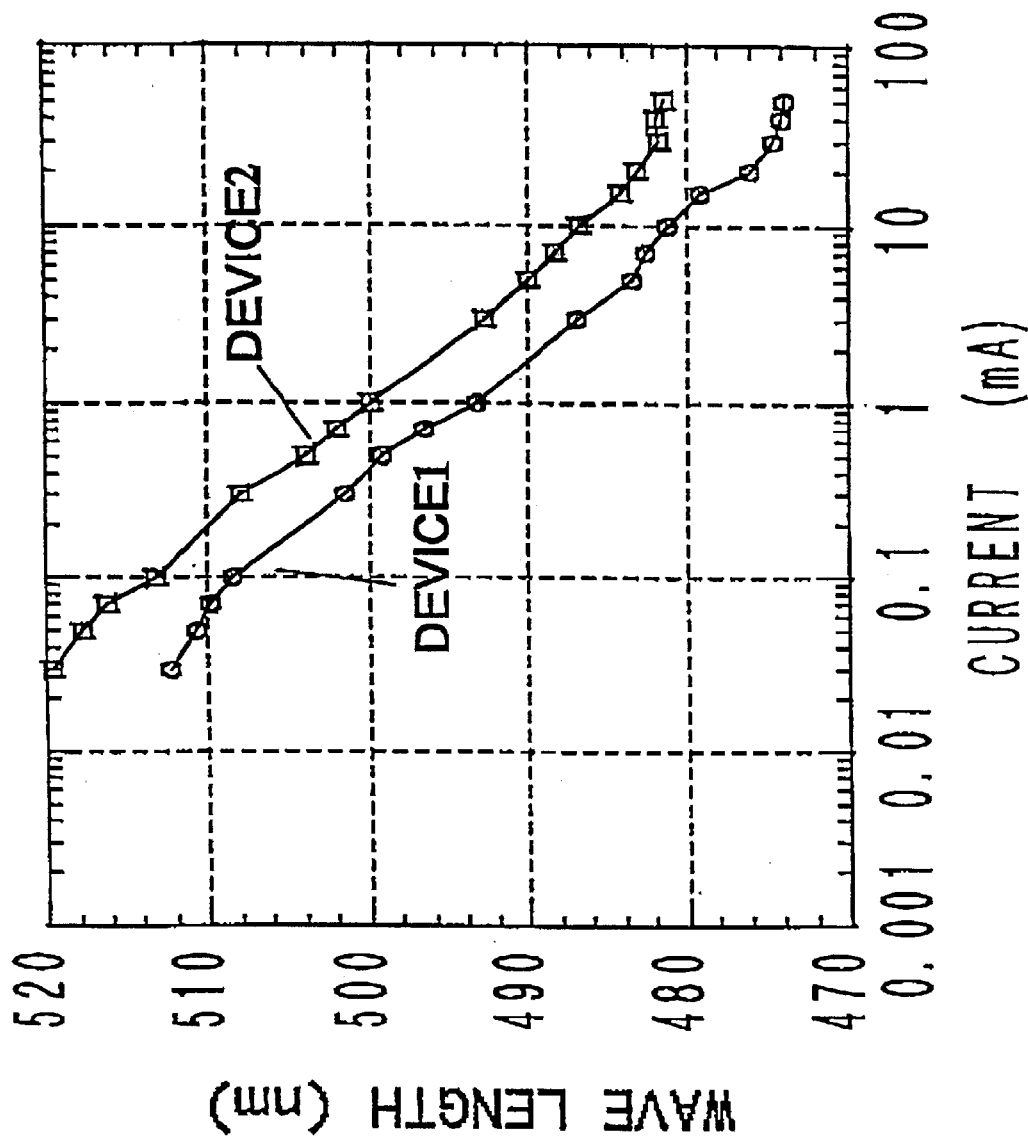
FIG. 3 is a graph showing current versus emission wavelength characteristics of the LED device of FIG. 2.

FIG. 3 is a graph showing a relationship between a driving current and an emission wavelength when a direct driving current is applied to the LED device 104 of Example 1. In FIG. 3, when DEVICE 1 is employed as the LED device 104, as the driving current is increased, the emission wavelength of the LED device 104 is shifted toward a shorter wavelength. That is, a blue shift phenomenon is observed. For example, when the driving current is about 0.1 mA, the emission wavelength is about 508 nm (green). When the driving current is about 1 mA, the emission wavelength in about 494 nm (blue-green). When the driving current is about 10 mA, the emission wavelength is about 481 nm (blue).

Thus, the emission wavelength is shifted by about 20 nm or more toward a shorter wavelength in the case of a 10 mA drive as compared with the case of a 0.1 mA drive. The wavelength shift toward a shorter wavelength by about 20 nm or more causes visual observation of a different color. In general, for an LED device 104 having its emission wavelength range In the visible spectrum, a change in emission wavelength caused by a change in driving current needs to be suppressed to about 6 nm or less in order to maintain the same visual color observed.

Figure 4:
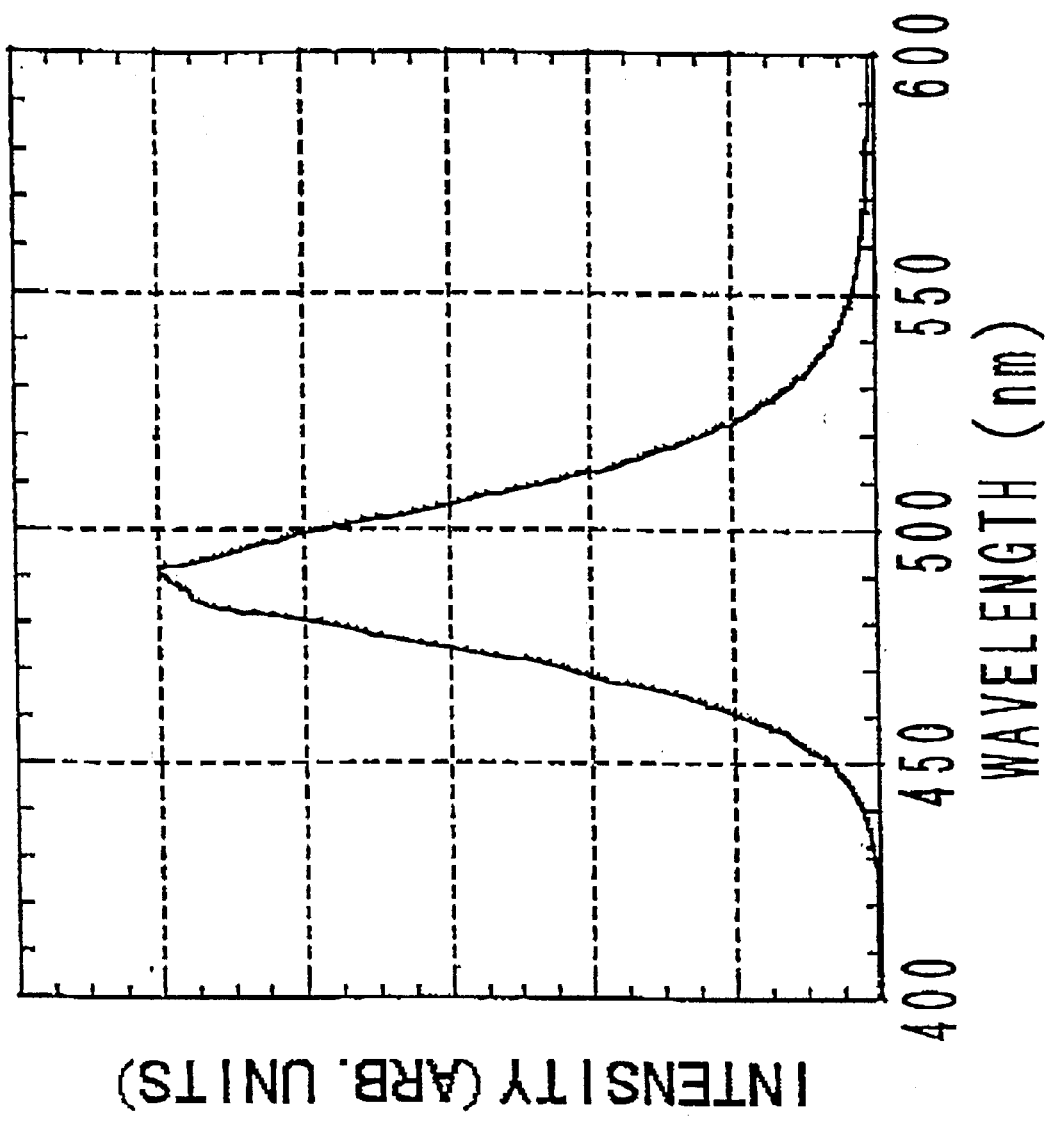
FIG. 4 is a graph showing an emission wavelength spectrum of the LED device of FIG. 2.

The emission wavelength is herein defined as follows. Referring to FIG. 4, the emission wavelength spectrum of the LED device 104 has a single peak and the half-value width of the emission wavelength is about 30 nm, resulting in an emission characteristic having a satisfactory color purity. In the LED device 104 of Example 1, the peak wavelength of the emission wavelength spectrum represents the color of light emitted from the LED device 104. The peak wavelength of an LED device is herein described as the emission wavelength of the LED device. For the sake of simplicity, an emission wavelength is used as a parameter of a light color.

Figure 5:
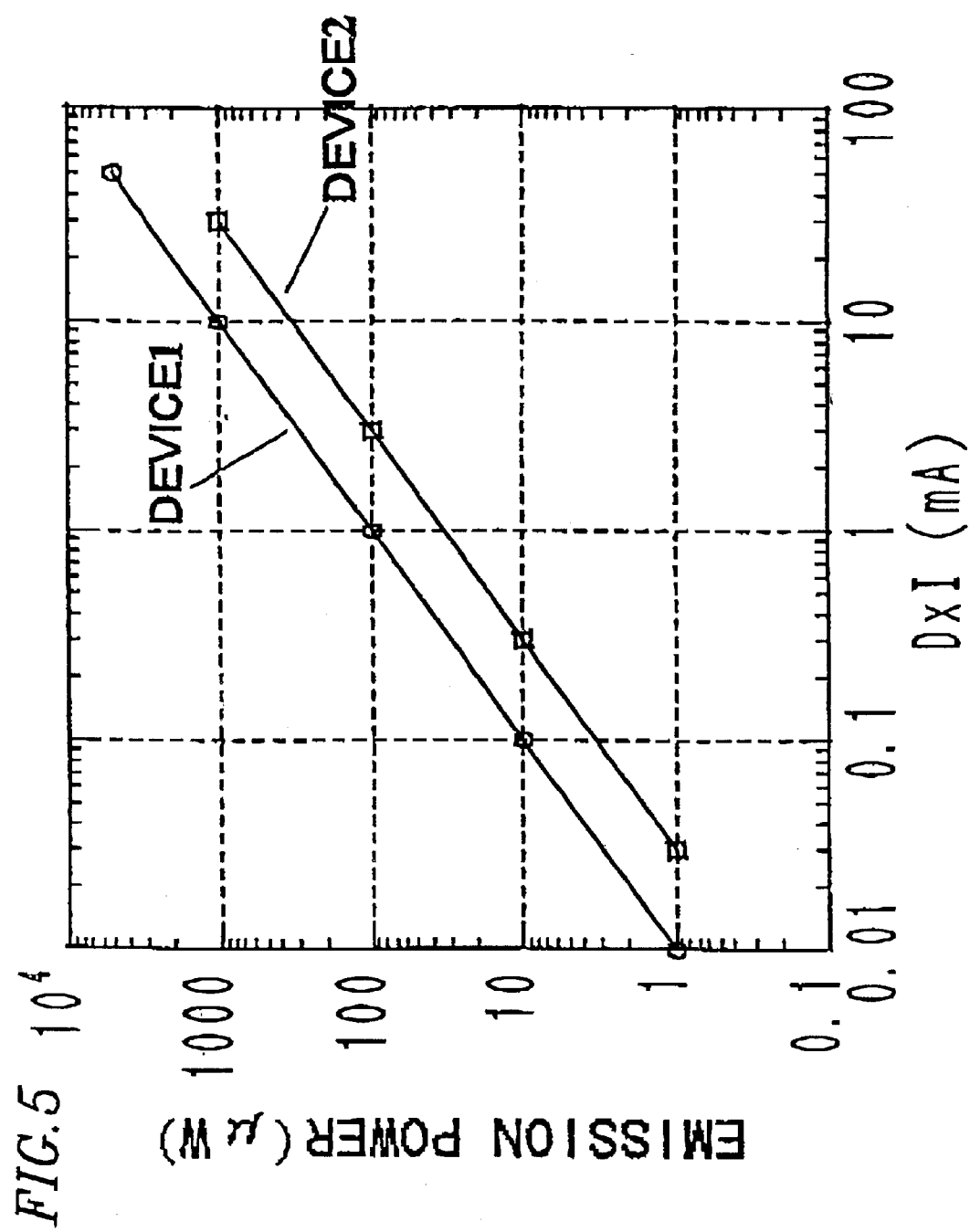
FIG. 5 is a graph showing the product of driving current and duty versus emission power characteristics of the LED device of FIG. 2 driven by the LED on-off circuit of the present invention shown in FIG. 1.
Figure 6:
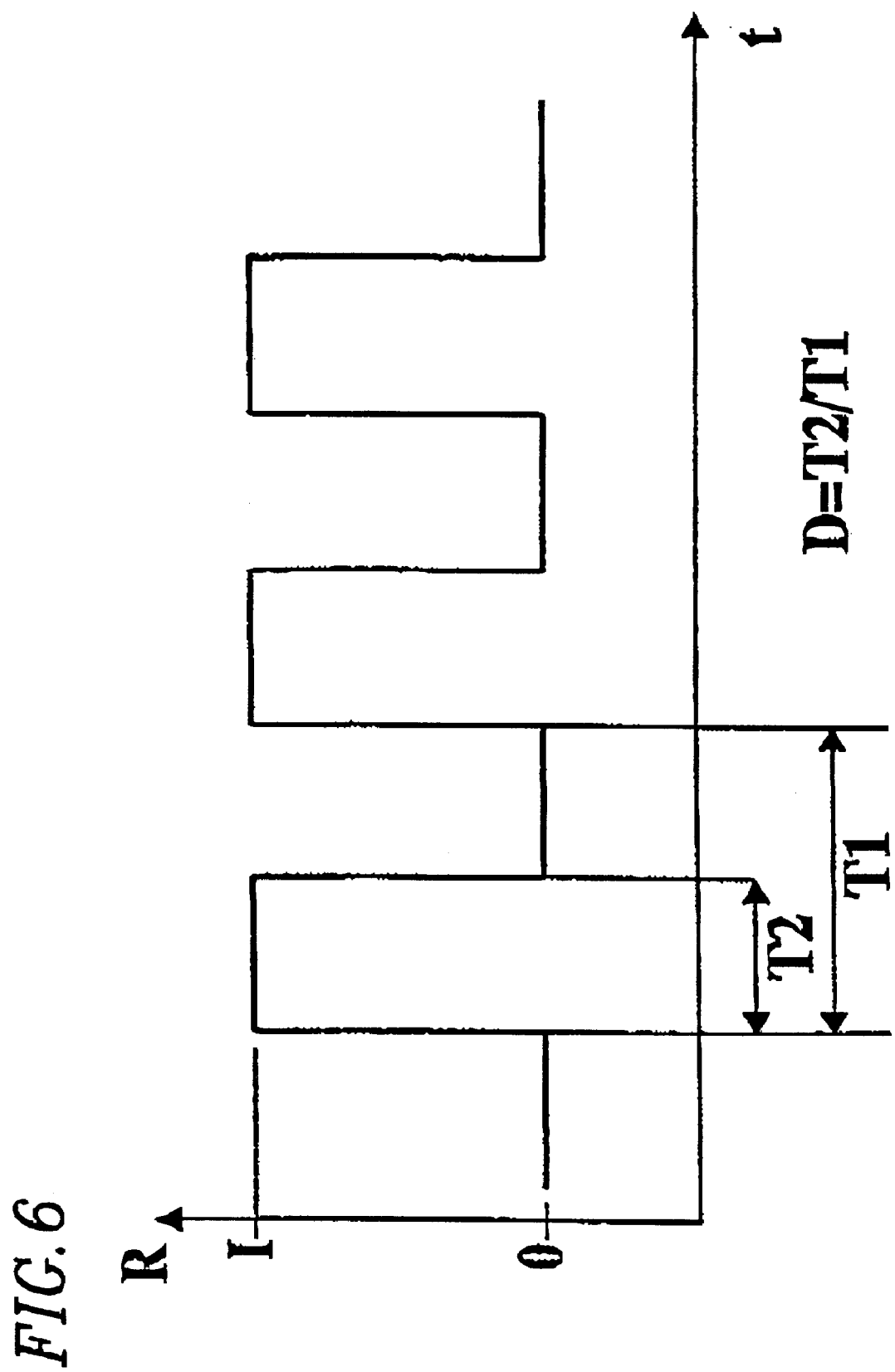
FIG. 6 is a schematic diagram illustrating a pulse signal generated by a pulse generator of the LED on-off circuit of the present invention shown in FIG. 1.

FIG. 5 is a graph showing the emission power characteristics of the LED device 104 of Example 1 when it is driven by a pulse current. The horizontal axis represents D×I (mA) where D is the duty D of the square wave pulse current R and I is the current value thereof. The vertical axis represents the emission power P (μW) of the LED device 104. The pulse herein means a periodic pulse as shown in FIG. 6. Referring to FIG. 6, the current value I represents a current value (peak value) of a pulse. The duty D is represented by $T_2/T_1$ where $T_1$ is the period of a pulse and $T_2$ is the duration of a pulse. Therefore, the product D×I of the duty D and the current value I represents a time-average current injected to the LED device 104.

In Example 1, for the sake of simplicity of description of the principle of the present invention, it is assumed that the LED device 104 is driven in a current region where the emission power is substantially proportional to the current value. In this case, the time-average emission power of the LED device 104 is proportional to the average current injected to the LED device, resulting In a substantially straight line as shown in FIG. 5. That is, it is believed that the emission power P is substantially equal to or proportional to D×I.

In this case, it is preferable that when a viewer observes the LED device 104, he or she does not sense a flicker. To this end, the period $T_1$ is about 30 ms or less, more preferably about 10 ms or less, and the period $T_2$ is preferably as long as or longer than the recombination life span of a carrier in the active layer. In the case where the LED device 104 includes an InGaN active layer, the pulse duration is about 0.2 ns or more, and more preferably about 1 ns or more.

The operation of the LED device of Example 1 will be described below with reference to FIGS. 1 through 6. In this case, an LED device 104 indicated by DEVICE 1 in FIGS. 3 and 5 has an emission wavelength of about 490 nm (blue-green) and an emission power of about 100 μW, for example. The emission power is used as a parameter of emission intensity. The LED on-off circuit 1 externally receives a color signal c ($=c_{490}$) indicating that the designated emission wavelength of the LED device 104 is about 490 nm and an intensity signal p ($\mu p_{100}$) indicating that the designated emission power of the LED device 104 is about 100 μW.

Initially, the color signal c is externally input to the color signal-current value converter 102. In the converter 102, the color signal c is converted to the current value signal 1 in accordance with driving current versus emission wavelength characteristics shown in FIG. 3 (DEVICE 1). When the color signal c ($=c_{490}$) is input to the converter 102, the current value corresponding to an emission wavelength of about 490 nm is about 2 mA in accordance with the driving current versus emission wavelength characteristics shown in FIG. 3 (DEVICE 1). The converter 102 generates a current value signal i ($=i_2$) indicating that the designated current value I of a pulse which should be output by the square wave pulse generator 103 is about 2 mA and sends the signal i to the calculation processor 101 and the square wave pulse generator 103.

The calculation processor 101 receives the intensity signal p and the above-described current value signal i, and calculates a duty D in accordance with the D×I versus emission power characteristics shown in FIG. 5 (DEVICE 1) where I is a current value and D is a duty.

As is seen from FIG. 5 (DEVICE 1), the product D×I of the duty D and the current value I is 1 mA with respect to the intensity signal p (=about 100 μW). As the current value indicated by the current value signal i is about 2 mA, the duty D is equal to about 0.5. Therefore, the calculation processor 101 generates a duty signal d ($=d_{0.5}$) indicating that the designated duty D of the pulse which the square pulse generator 103 should output is about 0.5, and sends the duty signal d to the square pulse generator 103.

The square pulse generator 103 generates and outputs a pulse current R having a current value I which is equal to 2 mA and a duty D which is equal to about 0.5, based on the current value signal i ($=i_2$) sent from the color signal-current value signal converter 102 and the duty signal d ($=d_{0.5}$) sent from the calculation processor 101. The LED device 104 is driven by the pulse current R.

In this way, light having a designated emission wavelength and emission power can be emitted even when an LED device having an emission wavelength which is dependent on a driving current value is employed.

The case where an LED device 104 Indicated by DEVICE 2 in FIGS. 3 and 5 outputs light having an emission power of about 100 μW and an emission wavelength of about 490 nm which are the same values as described above, will be described. As is seen from the driving current versus emission wavelength characteristics in FIG. 3, the emission wavelength of DEVICE 2 is shifted by about 6 nm toward a longer wavelength at each current value as compared to that of DEVICE 1. As is seen from the D×I versus emission power characteristics show in FIG. 5, the product of the current value I and the duty D of DEVICE 2 is shifted toward the lower light output side as compared to that of DEVICE 1.

When the color signal-current value signal converter 102 receives a color signal c ($=c_{490}$), the converter 102 generates a current value signal i ($=i_5$) designating a current of about 5 mA corresponding to an emission wavelength of about 490 nm in accordance with the driving current versus emission wavelength characteristics in FIG. 3 (DEVICE 2), and sends the current value signal i to the calculation processor 101 and the pulse generator 103.

The calculation processor 101 receives the current signal p ($=p_{100}$) and the current value signal i ($=i_5$). As is seen from the D×I versus emission power characteristics show in FIG. 5, the product D×I of the duty D and the current value I is about 3 with respect to the intensity signal p (=about 100 μW). As a current value indicated by the current value signal i is about 5 mA, the calculation processor 101 calculates that the duty D is equal to about 0.6.

The calculation processor 101 generates a duty signal d ($=d_{0.6}$) indicating that the designated duty D of the pulse which the pulse generator 103 should output is equal to about 0.6, and sends the duty signal d to the pulse generator 103.

The pulse generator 103 generates and outputs a pulse current R having a current value I of about 5 mA and a duty D of about 0.6, based on the current value signal i ($=i_5$) sent from the color signal-current value signal converter 102 and the duty signal d ($=d_{0.6}$) sent from the calculation processor 101. The LED device 104 is driven by the pulse current R. In this way, light having a designated emission wavelength and emission power can be emitted by driving the LED device 104 with the pulse current R.

As described above, with the driving method of the present invention, the LED device having an emission wavelength which is changed with a driving current value can be driven so that the LED device outputs light having a constant wavelength and power. When the LED devices having emission wavelengths which are changed with driving current values are driven at a predetermined driving current value, the emission wavelengths vary among the LED devices due to variations in characteristics of the LED devices, resulting in variations in color tones. Such a problem is solved by the present invention.

The relationship of the D×I versus the emission power shown in FIG. 5 maybe stored as a table or function in the calculation processor 101. The relationship between the current value versus the emission wavelength shown in FIG. 3 corresponding to a target LED device may be stored In the color signal-current value signal converter 102.

Although the above-described pulse wave is a square wave in Example 1, the pulse waveform generated by the pulse generator 103 is not limited to the square wave, but may be any form including a triangular wave. The pulse wave may be generated in the following way: (1) the duty is modified by changing the pulse duration while the period is maintained constant; (2) the duty is modified by changing the period while the pulse duration is maintained constant;

or (3) the duty is modified by changing the number of pulses in a predetermined period of time.

Figure 18:
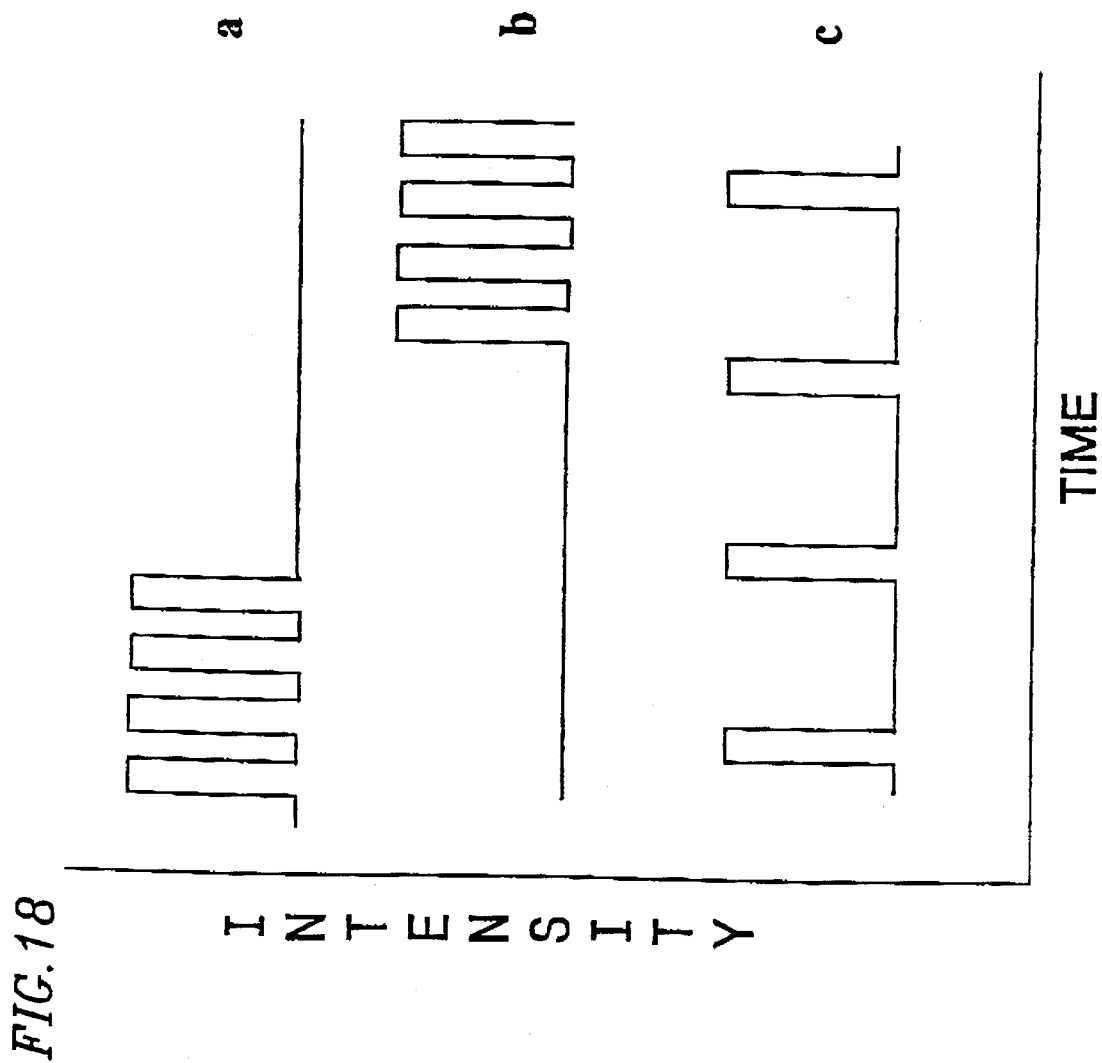
FIG. 18 is a schematic diagram illustrating forms of generated pulse signals.

The pulses may be concentrated In the first half of a predetermined period (a in FIG. 18), the pulses may be concentrated on the latter half of a predetermined period (b in FIG. 18), or the pulses are distributed in the entire predetermined period (a in FIG. 18). That is, as long as the average power of the driving current is constant, the shapes, the widths or the number of individual pulses may be arbitrarily selected using a simple method. As described above, there are the various methods for generating pulses, but the present invention is not limited to those methods. In the present invention, other pulse generation methods may be used.

EXAMPLE 2

In Example 2, the LED apparatus (including DEVICE 1) of Example 1 is employed. An attempt is made, where the emission intensity of the LED device 104 is temporally changed from about 50 μW to about 100 μW to about 200 μW while the emission wavelength of the LED device 104 is maintained constant. In such an attempt, the color signal c is constantly equal to $c_{490}$, and the intensity signal p is changed from $p_{50}$ to $p_{100}$ to $p_{200}$.

Since the color signal c is constantly equal to $c_{490}$, the color signal-current value signal converter 102 outputs the same current value signal i as that in Example 1, i.e., $i=i_2$.

The duty signal d output from the calculation processor 101 is calculated In a procedure similar to that in Example 1. As the intensity signal p is changed from $p_{50}$ to $p_{100}$ to $p_{200}$, the duty signals d (=$d_{0.25}$, $d_{0.5}$, and $d_1$), which cause the duty D to be about 0.25, about 0.5, and about 1, respectively, are sequentially sent to the pulse generator 103, Thus, in such a procedure similar to that in Example 1, the LED device 104 outputs light having a intensity which is changed temporally and a constant wavelength, the intensity and the wavelength being externally designated.

In Example 2, although the LED device having an emission wavelength (color tone) which varies depending on a driving current value is employed, the emission intensity can be solely changed while the emission wavelength (color tone) is maintained constant.

Such a driving method may be applied to a display apparatus which exhibit& a color tone by simultaneously employing a plurality of LED devices having different light colors. In this case, color shift can be suppressed. Alternatively, the driving method may be applied to a display apparatus in which a fluorescent is excited by the LED device so that the fluorescent emits light. In this case, a reduction in emission efficiency due to excitation wavelength shift, or color tone shift can be prevented. Even when an LED device having a characteristic different from the LED device in Example 2 is employed (there are variations in a characteristic), the emission intensity can be solely changed while a predetermined light color is maintained in a way and for the reasons similar to those described in Example 1.

EXAMPLE 3

Figure 7:
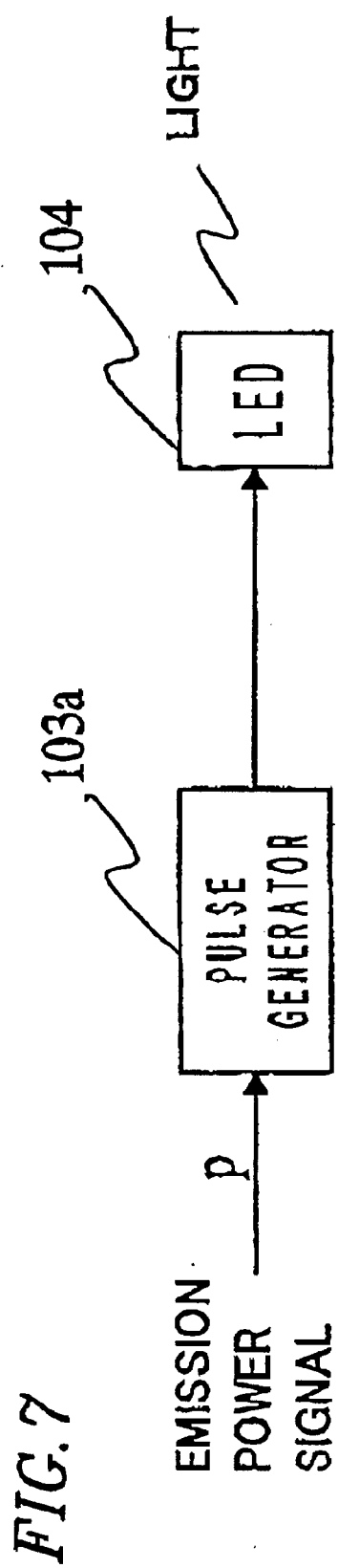
FIG. 7 is a schematic diagram illustrating an LED apparatus according to Example 3 of the present invention.

In Example 3, a simplified variant of the LED on-off circuit of Example 1 is provided. Referring to FIG. 7, the LED on-off circuit of Example 3 is comprised of only a square wave pulse generator 103a. It is only the intensity signal p that is externally Input to the LED on-off circuit. The square wave pulse generator 103a only modifies the duty of a current pulse which is to be supplied to the LED device 104 based on the value of the intensity signal p while maintaining the peak value of a current at a predetermined constant value. If a change in wavelength (blue shift) of the LED device 104 is controlled so that the range of change is about 6 nm or less, variation in the peak value of a current does not substantially cause problems. In this case, the peak value of a current is regarded as being constant. When the peak value of a current is set to the maximum of the range in which the reliability of the LED device 104 can be secured, the dynamic range of the emission intensity of the LED device 104 can be most preferably maximized. Specifically, the peak value of a pulse current is preferably set to about 10 mA or more and about 300 mA or less.

Even when the LED on-off circuit having such a simple configuration is employed, the LED device 104 can output light having an emission power in the range from about 0.1 mW to about 50 mW with respect to a pulse duty in the range from about 0.2% to about 100%. In this case, the emission wavelength of the LED device 104 is decreased by about 4 nm, i.e., from about 472 nm to about 468 nm. Such a change (i.e., about 4 nm) is less than about 6 nm at and above which a change in emission wavelength is visually recognized as a change in color.

Even when the calculation processor 101 of Example 1 using the color signal c and the color signal-current value signal converter 102 performing color control are not employed, a change in the light color of the LED device 104 due to the blue shift thereof can be significantly suppressed by controlling the emission power of the LED device 104 In the following way. A pulse having a constant peak value is input to the LED device 104 so that a change in the emission wavelength of the LED device 104 is less than about 6 nm, and a pulse duty is changed. Thereby, a change in the light color of the LED device 104 can be reduced to an extent in which a change in color is not visually recognizable.

When the peak value of a pulse current is set to the maximum of the range in which the reliability of the LED device 104 can be secured, the dynamic range of the emission intensity of the LED device 104 can be maximized.

EXAMPLE 4

In Example 4, the LED apparatus (including DEVICE 1) of Example 1 is employed. An attempt is made, where the emission wavelength of the LED device 104 is temporally changed from about 475 nm (blue) to about 485 nm (blue to blue-green) to about 494 nm (blue-green to green) while the emission intensity of the LED device 104 is maintained constant at about 60 μW. In such an attempt, the emission intensity signal p is constantly equal to $p_{60}$, and the color signal c is changed from $c_{475}$ to $c_{485}$ to $c_{494}$.

The color signal-current value signal converter 102 converts color signals c (=$c_{475}$, $c_{485}$, and $c_{494}$) to current value signals i (=$i_{30}$, $i_4$, and $i_1$) designating current values of about 30 mA, about 4 mA, and about 1 mA in accordance with FIG. 3 similar to Example 1.

The duty signal d output from the calculation processor 101 is calculated in a procedure similar to that in Example 1. As the current value signal p is changed from $i_{30}$, to $i_4$, to $i_1$, the duty signals d (=$d_{0.02}$, $d_{0.15}$, and $d_{0.6}$), which cause the duty D of the square wave pulse current R to be about 0.02, about 0.15, and about 0.6, respectively, are sequentially sent to the pulse generator 103.

Thus, in such a procedure similar to that in Example 1, the LED device 104 outputs light having a wavelength which is changed temporally and a constant intensity, the intensity and the wavelength being externally designated.

With the driving method of the present invention, the light color of an LED device can be changed without changing the emission intensity thereof. Thus, when the light color of an LED device is changed using the method of Example 4, a current value is preferably changed by a factor of about 10 or more in order to change a color tone, and more preferably by a factor of about 20 or more.

The driving method of Example 4 may be applied to a display apparatus. Since the emission wavelength can be changed using a single LED device without changing the emission intensity. Thereby, a display apparatus having a simple configuration and a significant visual effect can be achieved using the driving method of Example 4. The light color of an LED device can be continuously changed with ease by continuously changing a color signal which is to be input to an LED on-off circuit.

Further, in a combination of Examples 2 and 3, light having an arbitrary set of different wavelength and intensity values, e.g., about 490 nm and about 200 $\mu$W, and about 475 nm and about 60 $\mu$W, can be emitted by DEVICE 1, for example.

Figure 8:
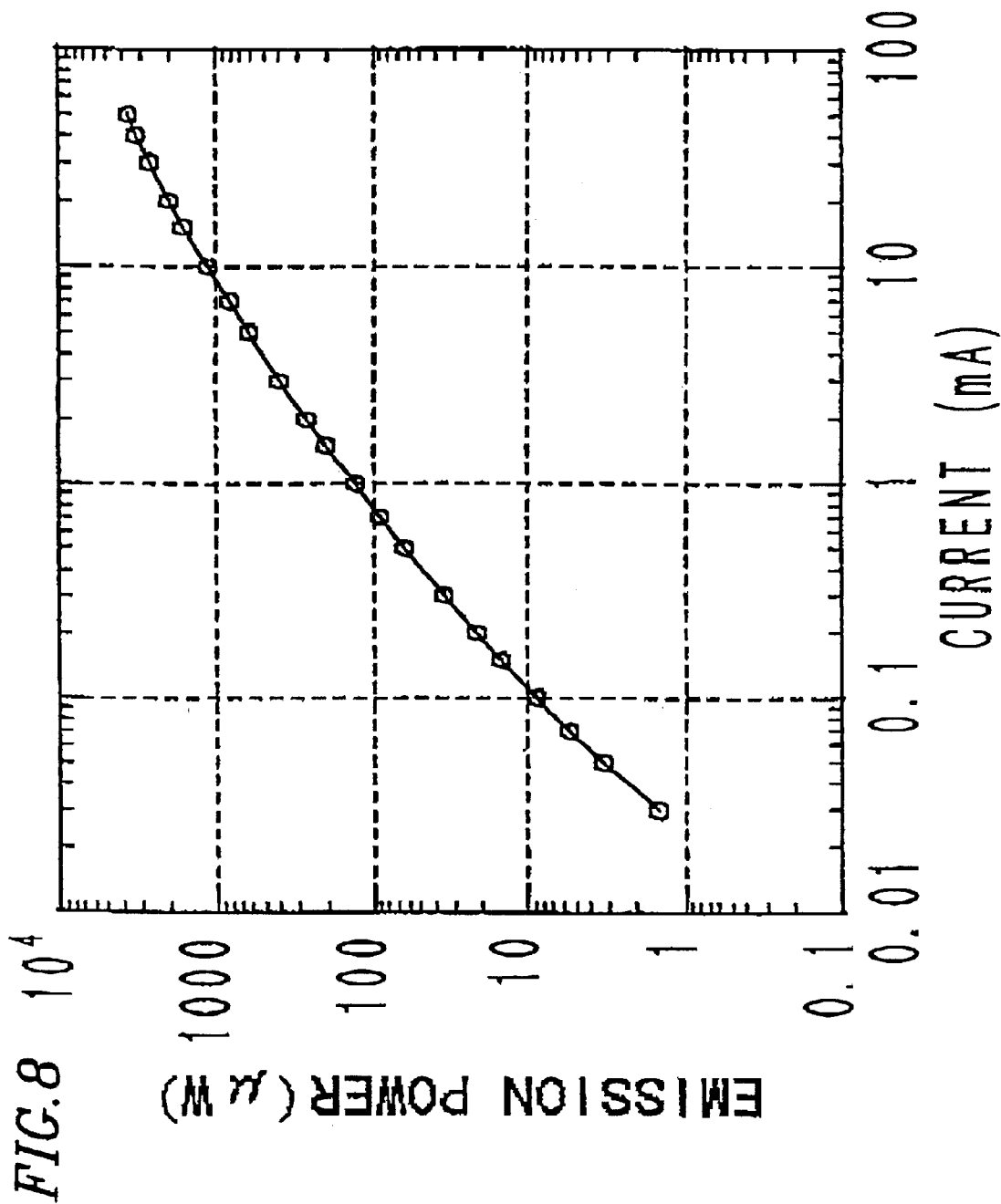
FIG. 8 is a graph showing the current versus emission power characteristics of an LED device driven by the LED on-off circuit of the present invention shown in FIG. 7.

In Examples 1 through 4, for the sake of simplicity, the operation of the LED device, in which the current value is proportional to the emission power, is described. The present invention is not limited to such an LED device. There are a number of actual LED devices which have such a proportional relationship. FIG. 8 shows current versus emission power (instantaneous value) characteristics of such an LED device In FIG. 8, the current value is not proportional to the emission power, so that the graph is a curve. In this case, the D×I versus emission power characteristics as shown in FIG. 5 cannot be drawn with a single line, but a different line must be used for each current value I.

An LED device having the current versus emission power characteristics shown In FIG. 8 is employed. Using the method of Example 1, the LED device is caused to emit light having a wavelength of about 490 nm and a power of about 100 $\mu$W which are the same target values as that in Example 1.

The color signal c (=$c_{490}$) is transferred to the color signal-current value signal converter 102 which in turn outputs a current value signal i (=$i_2$) designating a current value of about 2 mA. As is seen from FIG. 8, when the current value is about 2 mA, an LED device outputs light having a power of about 300 $\mu$W (instantaneous value). Therefore, the calculation processor 101 calculates a duty D which is equal to about 1/3 (=100 $\mu$W/300 $\mu$W), and outputs a duty signal d corresponding to the duty D. In the foregoing, it is considered that the duty D is proportional to the emission power p. However, when heat release is insufficient, if the product D×I of the duty D and the current value I is increased, the emission efficiency is decreased due to generated heat.

In this case, a proportional relationship is not necessarily established between the duty D and the emission power P. Nevertheless, the emission power P is represented by a function having the duty D and the current value I as parameters (or D is a function having P and I as parameters). The function is obtained by determining characteristics of an LED device in advance. The calculation processor 101 calculates the function based on the LED device 104 and outputs a duty signal d corresponding to the resultant duty D. Alternatively, a relationship between the emission power P, the duty D, and the current value I may be stored as a table. In this way, the driving method of the present invention can drive an LED device having current versus emission intensity characteristics are not linear.

In Examples 1 through 4, the color of light is represented using the peak value of a light spectrum as a parameter as described in Example 1. This is done for the sake of simplicity. This is not essential, however, to the present invention as described in Examples 1 through 4. For example, when a CIE standard chromaticity diagram is employed to represent the light color, the essence of the present invention is not impaired.

Further, in Examples 1 through 4, for the sake of simplicity, the emission intensity of an LED device is represented by the emission power (W), but another parameter may be employed. When a parameter in which visibility is taken into account, such as luminance (cd/m$^2$), luminous intensity (cd), or luminous flux (lm), is employed, if an LED device is driven in such a manner that the emission wavelength is changed while the emission intensity is maintained constant, apparent brightness is advantageously not changed due to a change in the emission wavelength. In this case, however, the relationship between the product D×I of the duty D and the current value I and the emission power cannot be represented by a single line on a graph. Nevertheless, the driving method of the present Invention can drive an LED device having current versus emission intensity characteristics are not linear. To this end, the relationship among the emission power P, the duty D, and the current value I is stored in the calculation processor 101 where the unit of the emission power P is different from that in Examples 1 through 4. The essence of the present invention described in Examples 1 through 4 does not depend on whether the current versus emission intensity characteristics of an LED device are linear or nonlinear.

Further, in Examples 1 through 4, the specific LED devices (DEVICE 1 and DEVICE 2) are employed, but the present Invention can be applied to any LED device having a wavelength which is decreased with an increase in current (a blue shift occurs in which the difference in wavelength between the minimum driving current and the maximum driving current set in a driving circuit is about 6 nm or more).

For example, in an LED device having almost the same configuration as that of the LED device shown in FIG. 2, when the composition of an InGaN active layer thereof is modified in such a manner that the current value is changed from about 0.1 mA to about 100 mA, the emission wavelength can be changed from about 590 nm to about 530 nm. The present invention can also be applied to an LED device in which an InGaN active layer or InGaAlN active layer is provided on a conductive (preferably n-type) GaN substrate. When these LED devices are employed in the configuration of Examples 1 through 4, an LED apparatus which emits light having a predetermined color from orange to yellow to yellow-green to green can be achieved.

EXAMPLE 5

Figure 9:
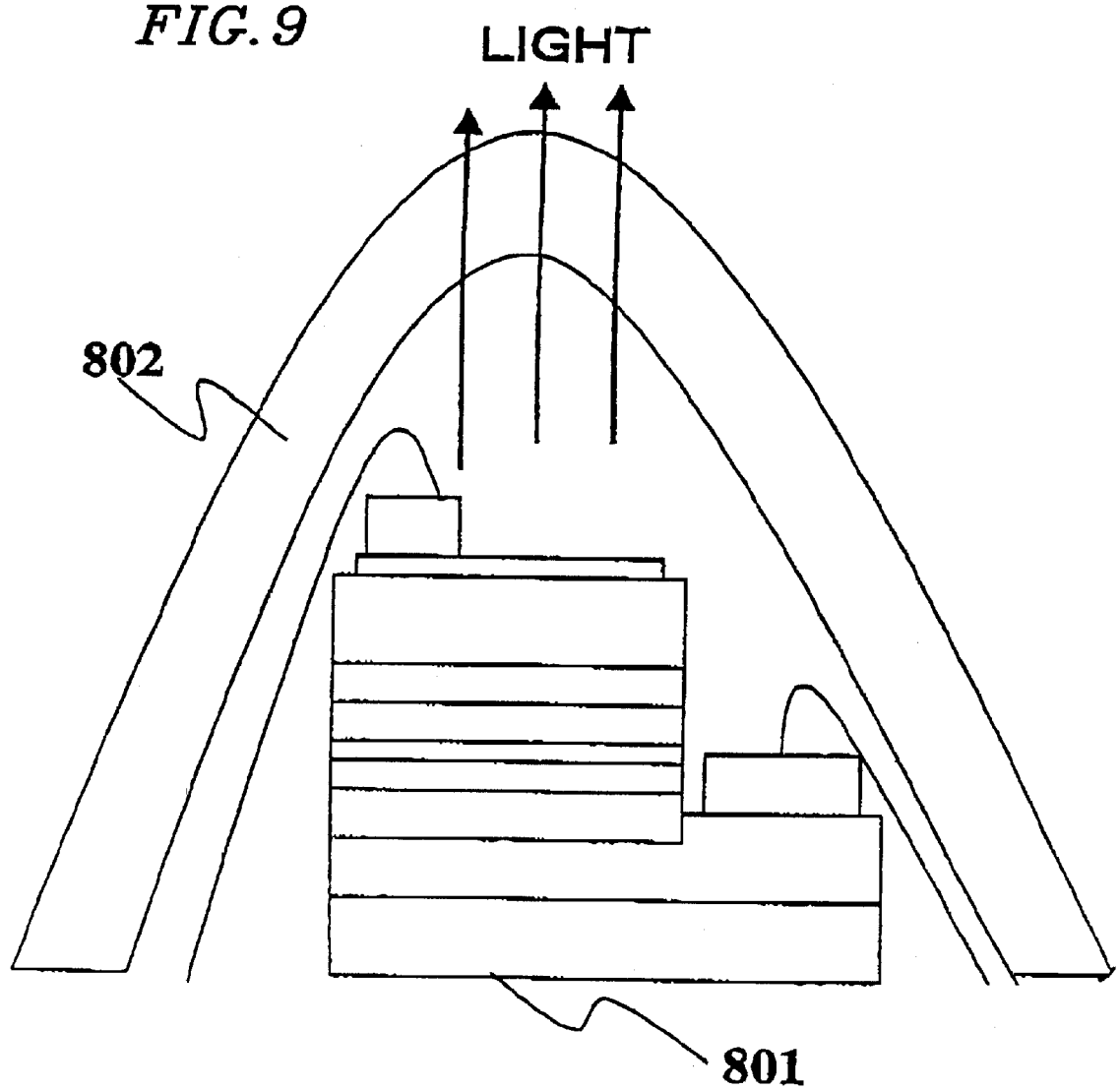
FIG. 9 is a schematic diagram illustrating an LED bullet according to Example 5 of the present invention.

FIG. 9 is a diagram illustrating an LED bullet according to Example 5 of the present invention. The LED bullet of Example 5 includes an LED device 801 having a light color which is changed with a driving current value and a fluorescent 802 provided in a light emitting direction of the LED device 801. Light output from the LED device 801 and light output from the fluorescent 802 are mixed, and the mixed light is output from the LED bullet. The LED device 801 is the same as that in Example 1.

Figure 10:
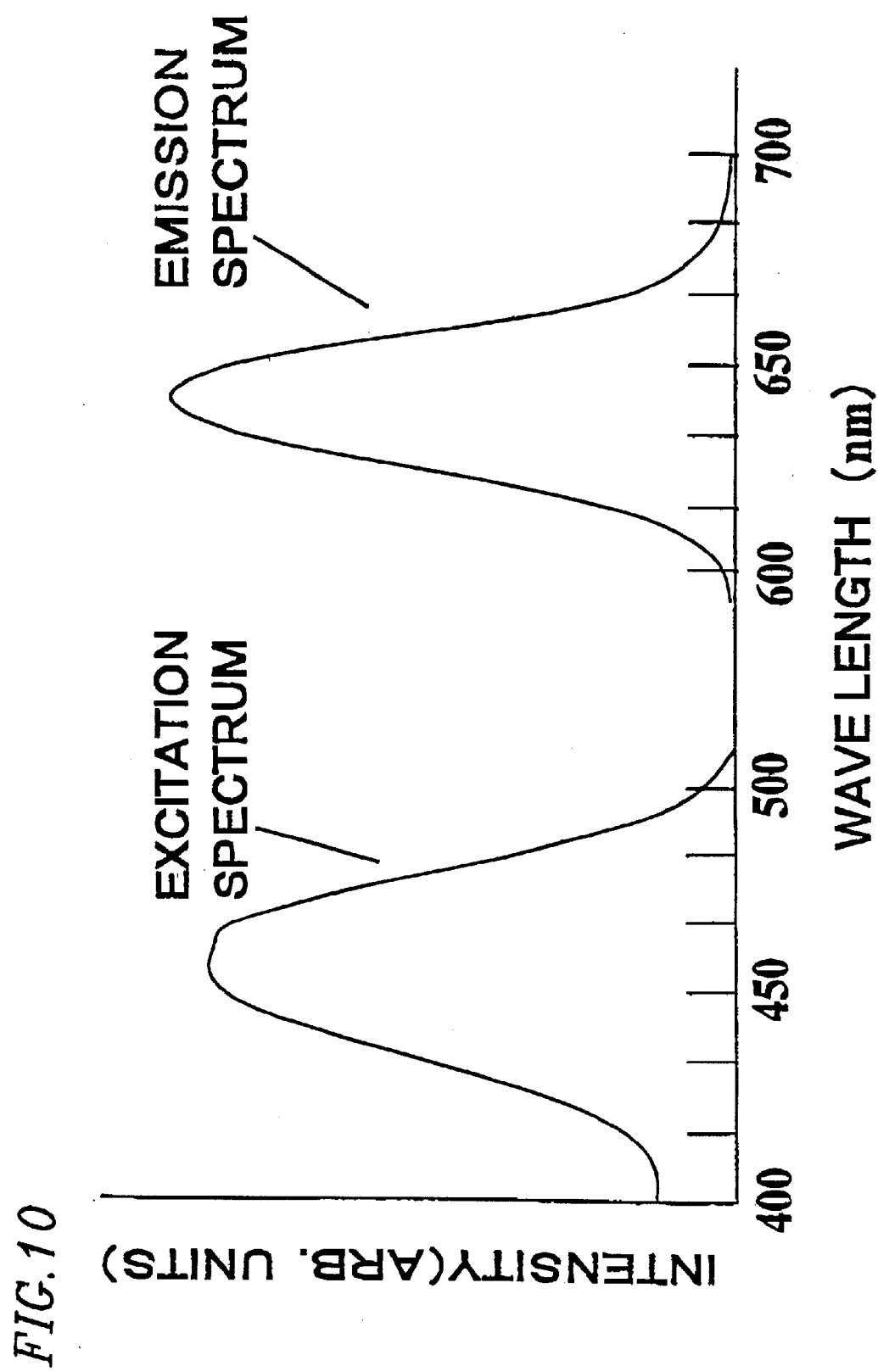
FIG. 10 is a graph showing the excitation spectrum and emission spectrum of a fluorescent used in the LED bullet of Example 5.

The operation of the LED bullet of Example 5 will be described below. FIG. 10 is a graph showing excitation and emission spectra when the fluorescent 802 is excited at about 460 nm. The peak of the excitation spectrum of the fluorescent 802 used in Example 5 is about 460 nm. It has been found that when the fluorescent 802 is irradiated with light having a wavelength of about 460 nm, the fluorescent 802 emits light having the emission spectrum shown in FIG. 10 with the most efficiency. In Example 5, the peak wavelength of the emission spectrum is about 630 nm, which indicates red light. An example of a fluorescent having such a characteristic is a YAG fluorescent.

It is assumed that the fluorescent 802 is excited by the LED device 801 having the current versus emission wavelength characteristics shown in FIG. 3 (DEVICE 1). As a driving current supplied to DEVICE 1 is changed from about 0.1 mA to about 2 mA to about 30 mA, the emission wavelength of DEVICE 1 is changed from about 508 nm (green) to about 490 nm (blue-green) to about 474 nm (blue), respectively.

Figure 11:
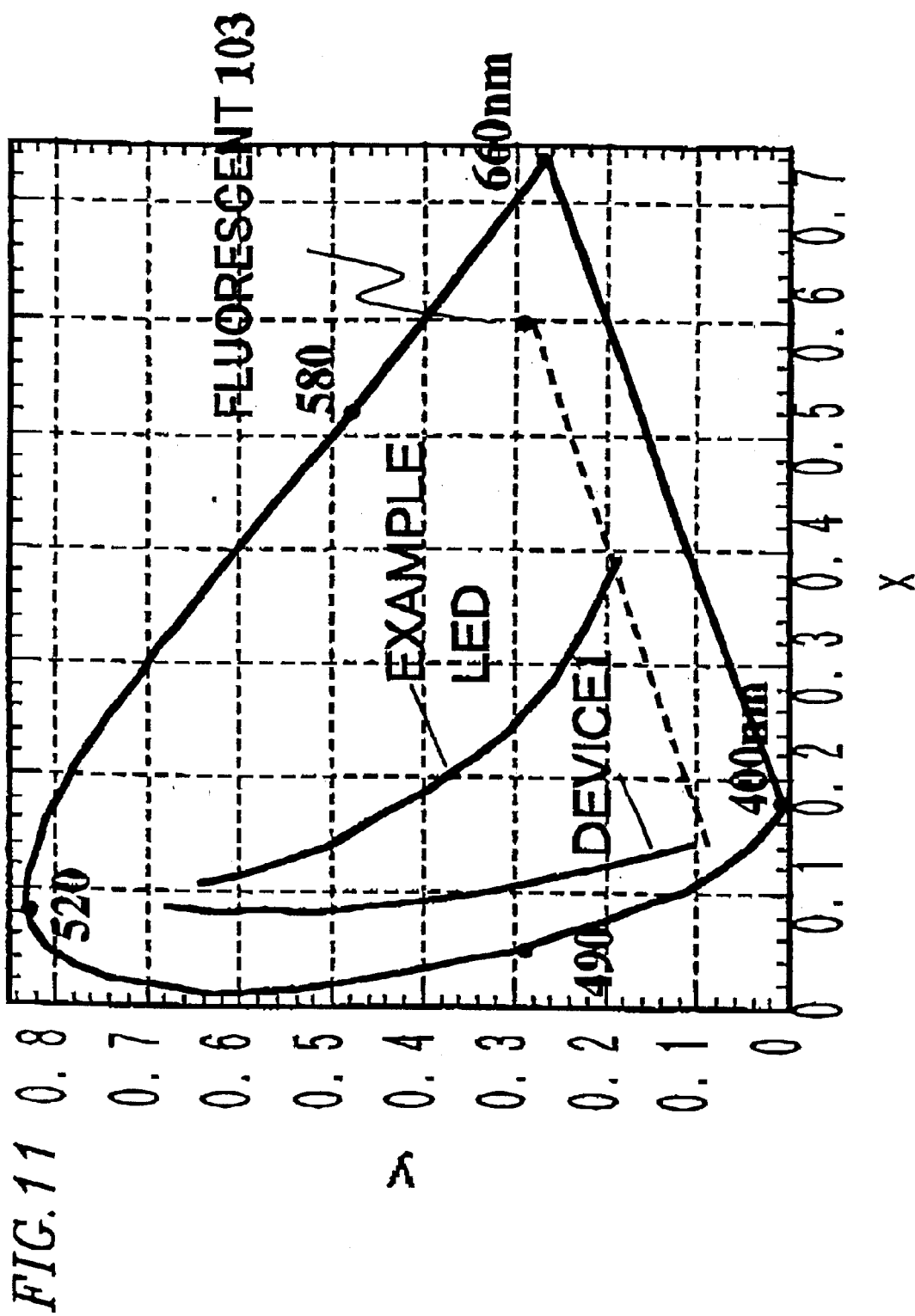
FIG. 11 is a CIE standard chromaticity diagram.

FIG. 11 is a CIE standard chromaticity diagram. In FIG. 11, a line indicated by DEVICE 1 represents the light color of DEVICE 1 when the driving current value is changed from about 0.1 mA to about 2 mA to about 30 mA. A point indicated by FLUORESCENT 103 represents the light color of the fluorescent 802 which has the emission spectrum shown in FIG. 10. As is seen from the excitation spectrum of the fluorescent shown in FIG. 10, when the emission wavelength of DEVICE 1 is about 508 nm, the driving current supplied to DEVICE 1 is small, so that the emission power is small. In this case, the emission wavelength is located at an end of the excitation spectrum, so that the fluorescent 802 is substantially not excited. In contrast, when the emission wavelength of DEVICE 1 is about 474 nm, the driving current is large, so that the emission power is large. In this case, the emission wavelength is located in the vicinity of the peak of the excitation spectrum, so that DEVICE 1 is significantly excited to emit light. Thus, the shorter the emission wavelength of DEVICE 1, the more significantly the fluorescent is excited.

For example, in the LED bullet of Example 5, when the LED device 801 is driven at about 0.1 mA, the LED device 801 emits light having a wavelength of about 508 nm, but the fluorescent is substantially not excited. In this case, the LED device 801 substantially solely emits light (green) in the LED bullet.

When the LED device 801 is driven at about 30 mA, light (i.e., blue, about 474 nm) emitted from the LED device 801 and light (i.e., red, about 630 nm) emitted from the fluorescent 802 excited by light emitted from the LED device 801 are mixed, so that the mixed light is red violet.

When the LED device 80 is driven at about 2 mA, an emission wavelength of about 490 nm (blue-green) is obtained, even though the emission power of the LED device 801 is not large, and the emission of the fluorescent 802 is not very large since the emission wavelength is in the vicinity of an edge of the emission spectrum. Light emitted from the fluorescent 802 and light (i.e., blue-green, about 490 nm) emitted from the LED device 801 are mixed, so that the mixed light is white.

Thus, the light color of the LED bullet when the current value is changed from about 0.1 mA to about 2 mA to about 30 mA is shown with a line indicated by EXAMPLE LED In-the CIE standard chromaticity diagram of FIG. 11. Thus, when the current value is changed from about 0.1 mA to about 2 mA to about 30 mA, the light color of the LED bullet of Example 5 is changed from green to white to red violet, respectively.

As described above, in Example 5, the combination of the LED device having a light color which is changed with a current and the fluorescent allows the LED bullet to achieve the change in the light color due to a change in current that is not obtained using only an LED device.

In Example 5, the specific fluorescent shown in FIG. 10 is employed. There are various types of fluorescents. Appropriate combinations of LED devices and fluorescents can lead to variations in light color due to a change in current.

EXAMPLE 6

Similar to FIG. 9, the LED bullet of Example 6 includes an LED device 801 having a light color is changed with a driving current value, and a fluorescent 802 provided in a light emitting direction of the LED device 801. Light output from the LED device 801 and light output from the fluorescent 802 are mixed, and the mixed light is output from the LED bullet. The operation of the LED device 801 of Example 6 will be described below.

Figure 12:
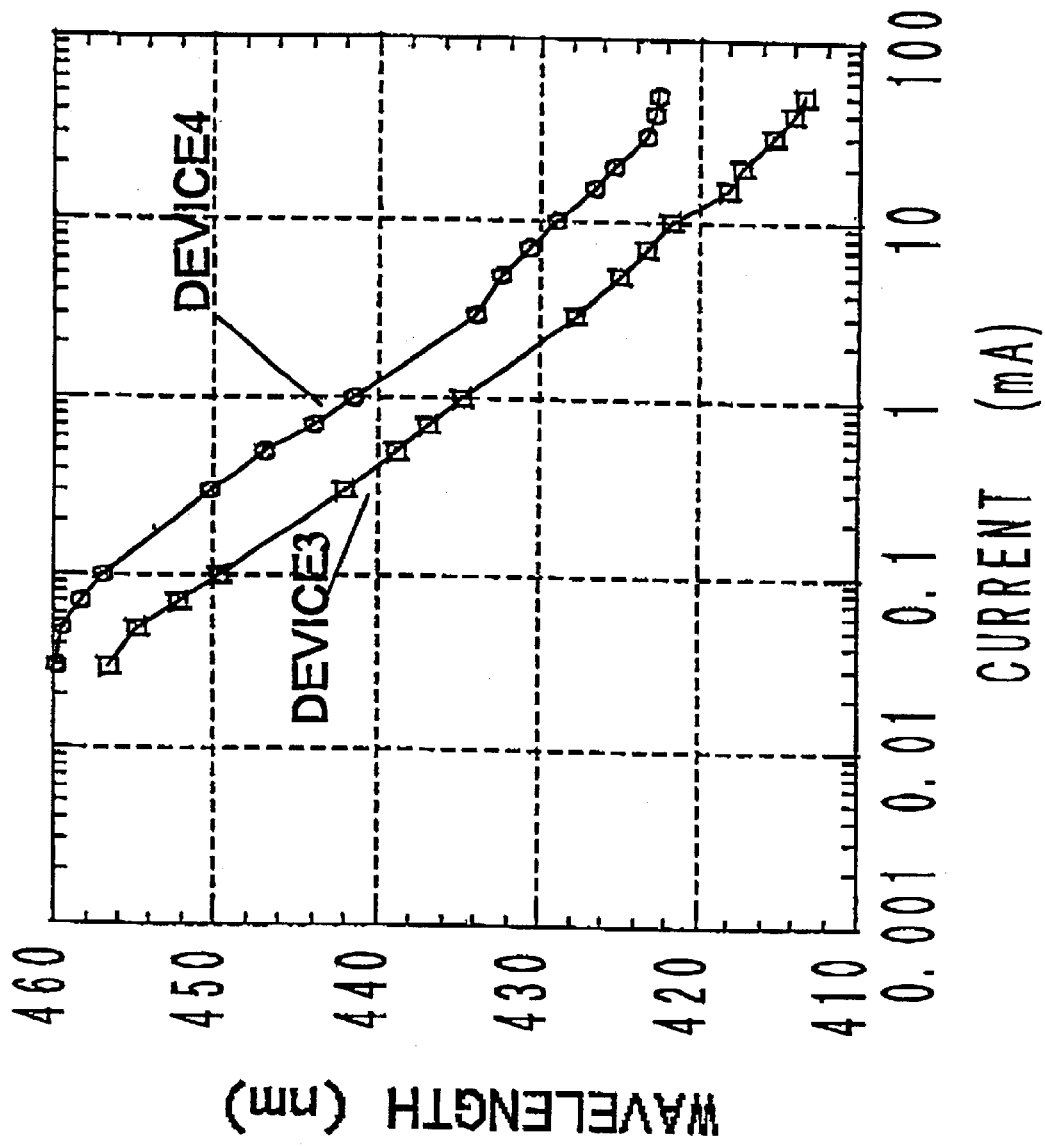
FIG. 12 is a graph showing the current versus emission wavelength characteristics of an LED device employed in Example 6 of the present invention.
Figure 13:
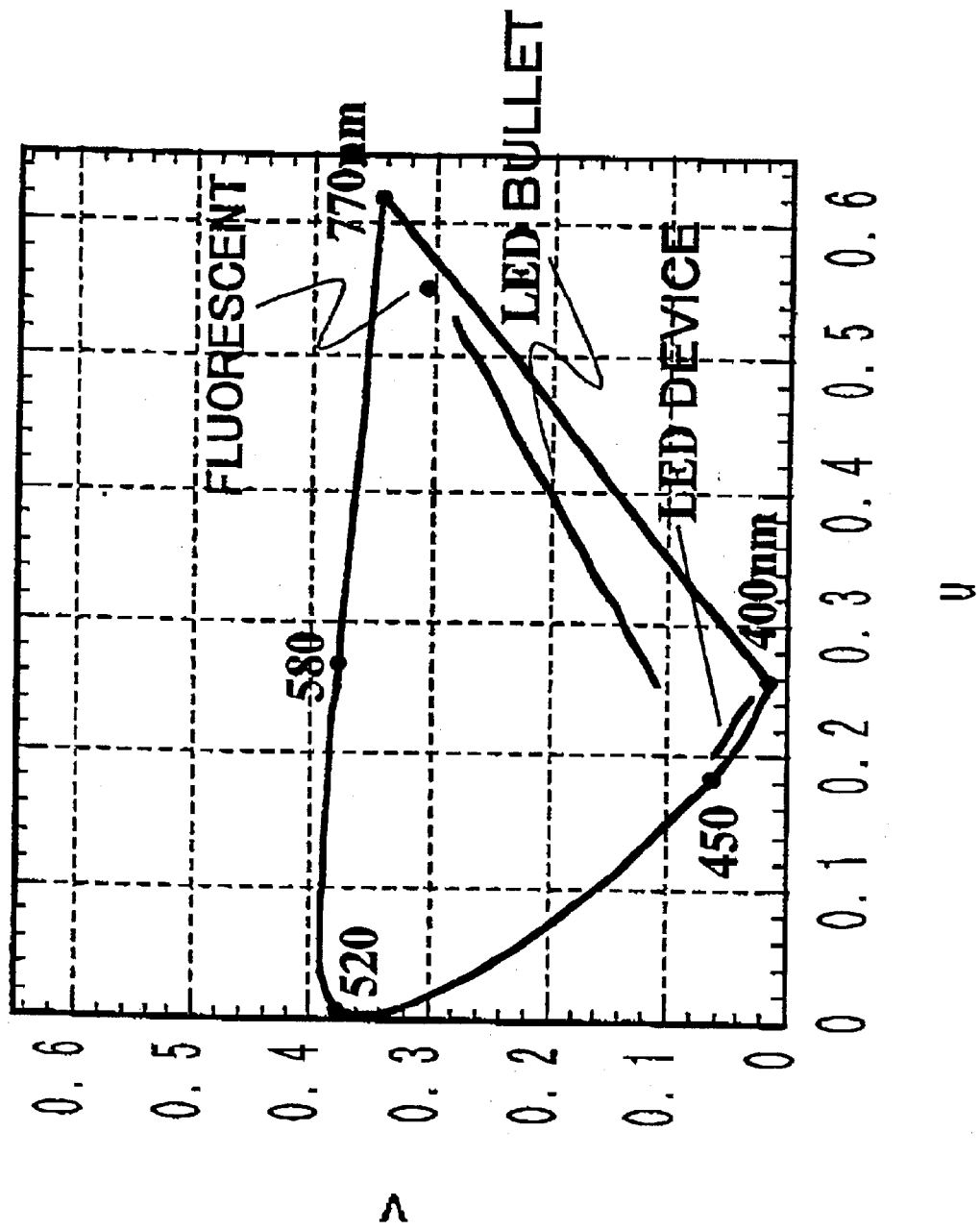
FIG. 13 is a UCS chromaticity diagram.

FIG. 12 is a graph showing the current versus emission wavelength characteristics of the LED device of Example 6. In FIG. 12, DEVICE 3 indicates the LED device in which the emission wavelength is changed from about 450 nm (blue) to about 430 nm (blue) to about 415 nm (blue-violet) as the current value is respectively changed from about 0.1 mA to about 2 mA to about 30 mA. DEVICE 3 can be obtained by changing the composition of the InGaN layer of the LED, device shown in Example 1 and FIG. 2. FIG. 13 is a CIE1960UCS chromaticity diagram. A chromaticity coordinate (u, v) in the CIE1960USC chromaticity diagram has a relationship with the corresponding chromaticity coordinate (x, y) in the CIE standard chromaticity diagram, the relationship being:

$u=4x/(-2x+12y+3)$, and $v=6y/(-2x+12y+3)$.

The UCS chromaticity diagram has a characteristic that the distance between two coordinate points having different colors corresponds to a color difference visually recognized. In FIG. 13, a line Indicated by LED device shows a change in the light color of the LED device of Example 6 when a driving current supplied to the LED device is changed from about 0.1 mA to about 30 mA. In this case, (u, v) is respectively changed from about (0.25, 0.03) to about (0.19, 0.06). Therefore, the distance between the coordinate points (color difference) is about 0.07.

Figure 14:
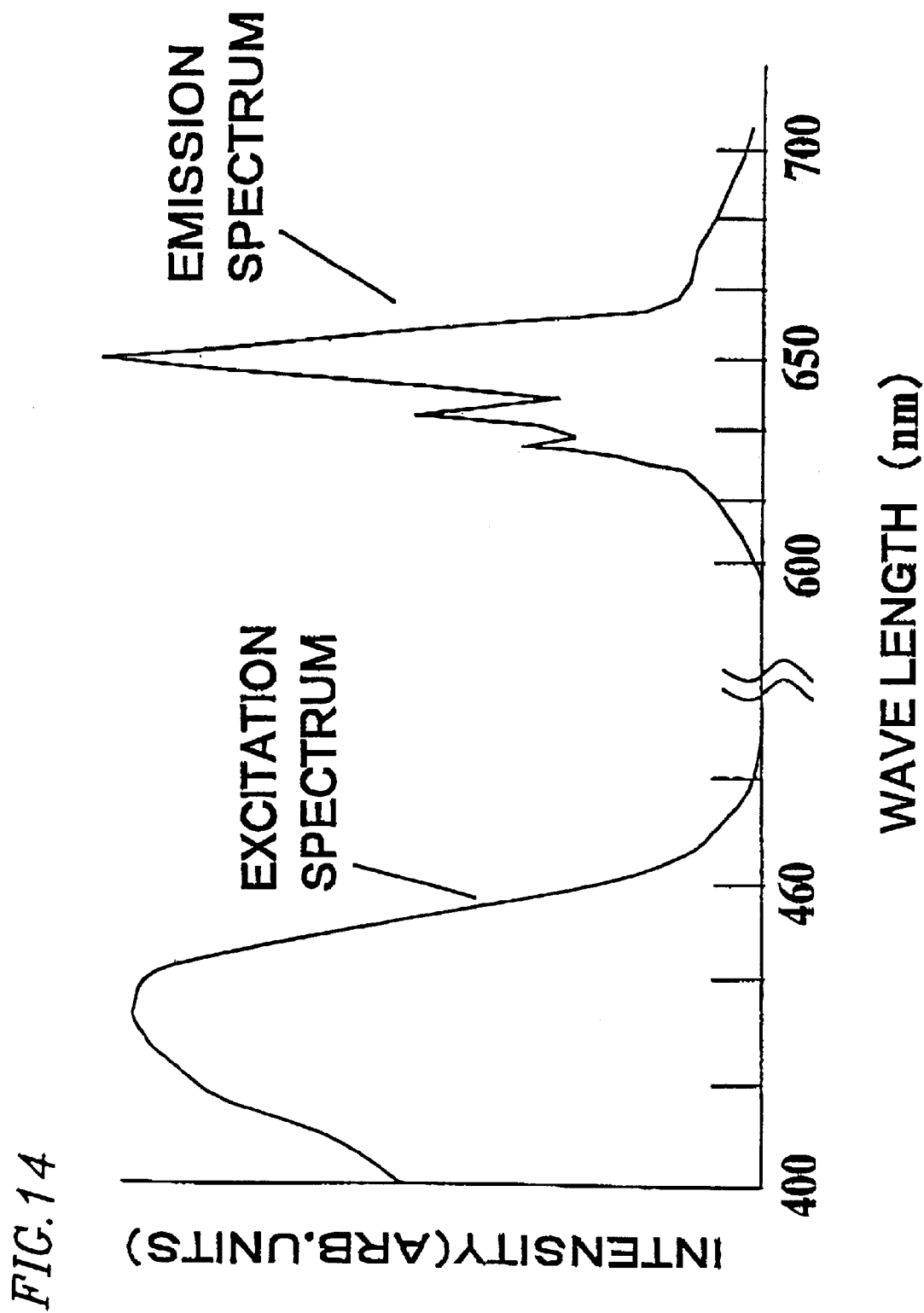
FIG. 14 is a graph showing the excitation spectrum and emission spectrum of a fluorescent used In Example 6.

FIG. 14 is a graph showing the excitation spectrum and emission spectrum of a fluorescent of Example 6. In FIG. 14, the peak wavelength of the excitation spectrum is about 430 nm. When the fluorescent is irradiated with light having such a wavelength, the fluorescent emits light having the emission spectrum with the most efficiency. In FIG. 14, the peak wavelength of the emission spectrum is about 650 nm having a color which is red. Such a fluorescent can be made of $6MgO \cdot As_2O_5:Mn^{4+}$. In FIG. 13, a coordinate point (u, v) (=(0.55, 0.31)) indicated by FLUORESCENT represents the light color of the fluorescent of Example 6.

According to the excitation spectrum of the fluorescent shown in FIG. 14, when the emission wavelength of DEVICE 3 is about 450 nm (0.1 mA), the emission power of the LED device is small, so that the fluorescent is substantially not excited. However, as the emission wavelength of DEVICE 3 becomes shorter (e.g., 415 nm (30 mA)), the emission power of the LED device becomes larger while light emitted from the LED approaches the peak of the excitation spectrum of the fluorescent.

Therefore, the fluorescent is significantly excited to emit light. The LED bullet emits blue light which is dominated by light emitted from the LED device when the LED device is driven at about 0.1 mA.

When the LED device is driven at about 30 mA, Light (i.e., red, about 660 nm) emitted from the fluorescent and light (i.e., blue-violet, about 415 nm) emitted from the LED device are mixed. Since the visibility of the light color of the LED device is low, the light (i.e., .53 red light, about 660 nm) of the fluorescent is dominant Thereby, red is visually recognized.

Further, when DEVICE 3 is driven at about 2 mA, the emission wavelength of DEVICE 3 is about 430 nm, i.e., blue. In this case, whereas the emission power of the LED device is very large, the emission of the fluorescent is not very large. The light is mixed to be violet.

The light color of the LED bullet when the driving current value is changed from about 0.1 mA to about 2 mA to about 30 mA is shown with a line indicated by LED BULLET in the UCS chromaticity diagram of FIG. 13. The color tone (u, v) of the LED bullet is respectively changed from about (0.25, 0.1) to about (0.53, 0.28). The distance (color difference) between the coordinate points is about 0.33.

Thus, when the current value is modulated, the color tone of the LED bullet of Example 6 is changed more significantly than the color tone of the LED device used in Example 6. This is because the fluorescent used in Example 6 is one having an excitation efficiency which is significantly changed (by a factor of about 2 or more, preferably about 5 or more) as the emission wavelength of the LED device is changed.

As described above, an LED device having a light color which is changed with a current value is combined with a fluorescent having an excitation efficiency which is significantly changed as the emission wavelength of the LED device is changed. The resultant LED bullet has a more significant change in a light color with a current value than a change in a light color of the LED device.

EXAMPLE 7

Similar to Example 1, a light emitting apparatus according to Example 7 of the present invention includes: a light emitting section for emitting light in which a color of the light is blue shifted with a value of a driving current; and a driving section for driving the light emitting section so that the light emitting section emits light having a desired color and a desired intensity, by generating the driving current based on a signal designating the desired color and a signal designating the desired intensity and by applying the driving current to the light emitting section. In description of Example 7, the light emitting section serves as an LED bullet, and the driving section serves as an LED on-off circuit.

Figure 17:
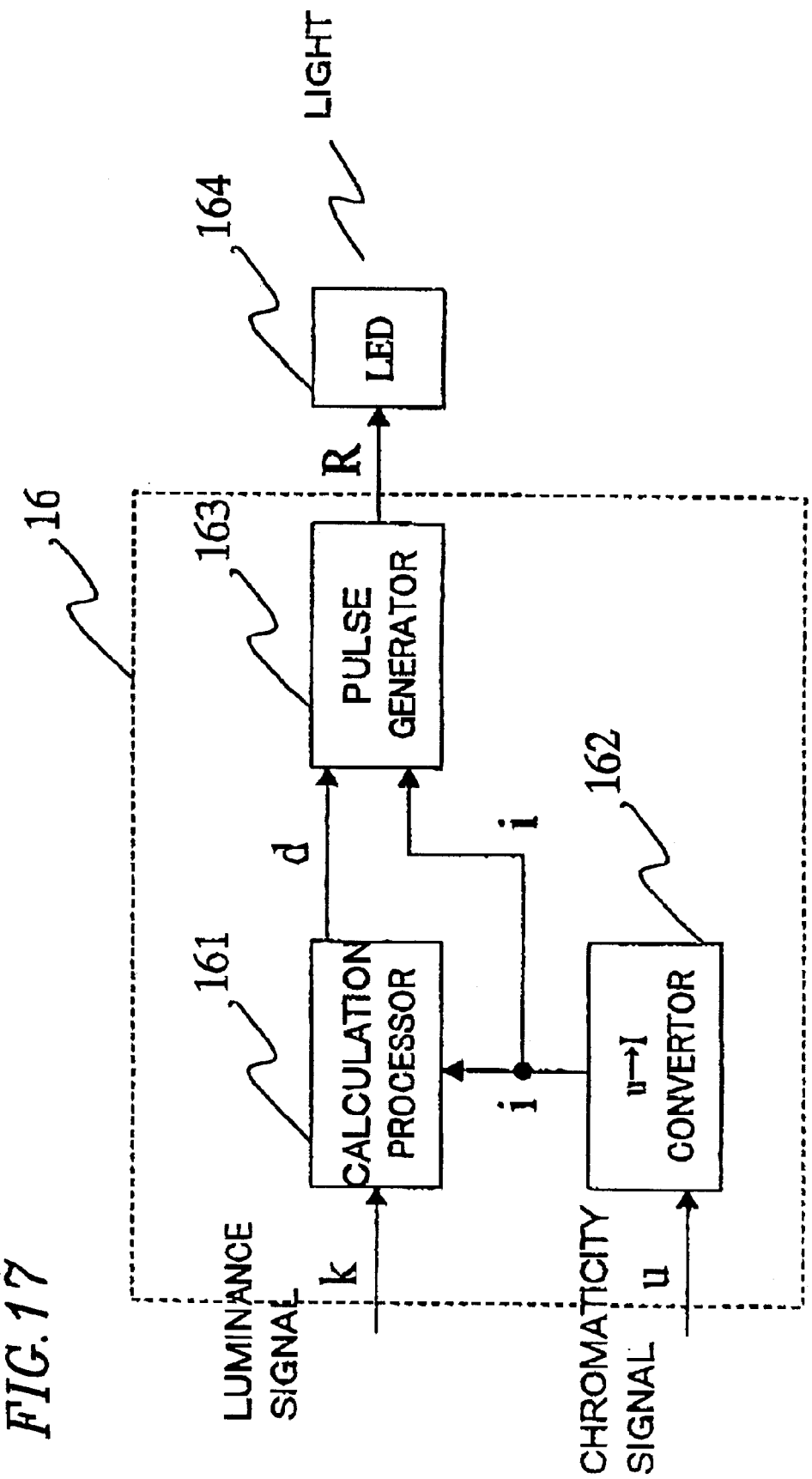
FIG. 17 is a schematic diagram illustrating an LED on-off circuit employed in Example 7.

An LED apparatus according to Example 7 will be described below. In the LED apparatus, the LED bullet of Example 5 is driven using an LED on-off circuit similar to that of Example 1. The basic structure of the LED on-off circuit of Example 7 is the same as that shown in FIG. 1, but is newly shown in FIG. 17. The LED apparatus of Example 7 differs from that of Example 1 in that an LED device 164 is an LED bullet in which a fluorescent is provided in a light emitting direction of an LED device as described in Example 5. Further, in FIG. 17, an LED on-off circuit 16 receives a luminance signal k designating the emission intensity of the LED bullet 164 and a chromaticity signal u designating the light color of the LED bullet 164, and outputs a pulse current R having a current value of I and a duty of D. The LED bullet 164 is driven in accordance with the pulse current R. The LED on-off circuit 16 includes: a chromaticity signal-current value signal converter 162 for converting the chromaticity signal u to a current value signal i designating a current value I; a calculation processor 161 for calculating and outputting duty signal d designating a duty D based on the luminance signal k and the current value signal i; and a square wave pulse generator 163 for outputting a square wave pulse current R as an LED driving current based on the current value signal i and the duty signal d. The square wave pulse current R has a current value of I and a duty of D.

Figure 16:
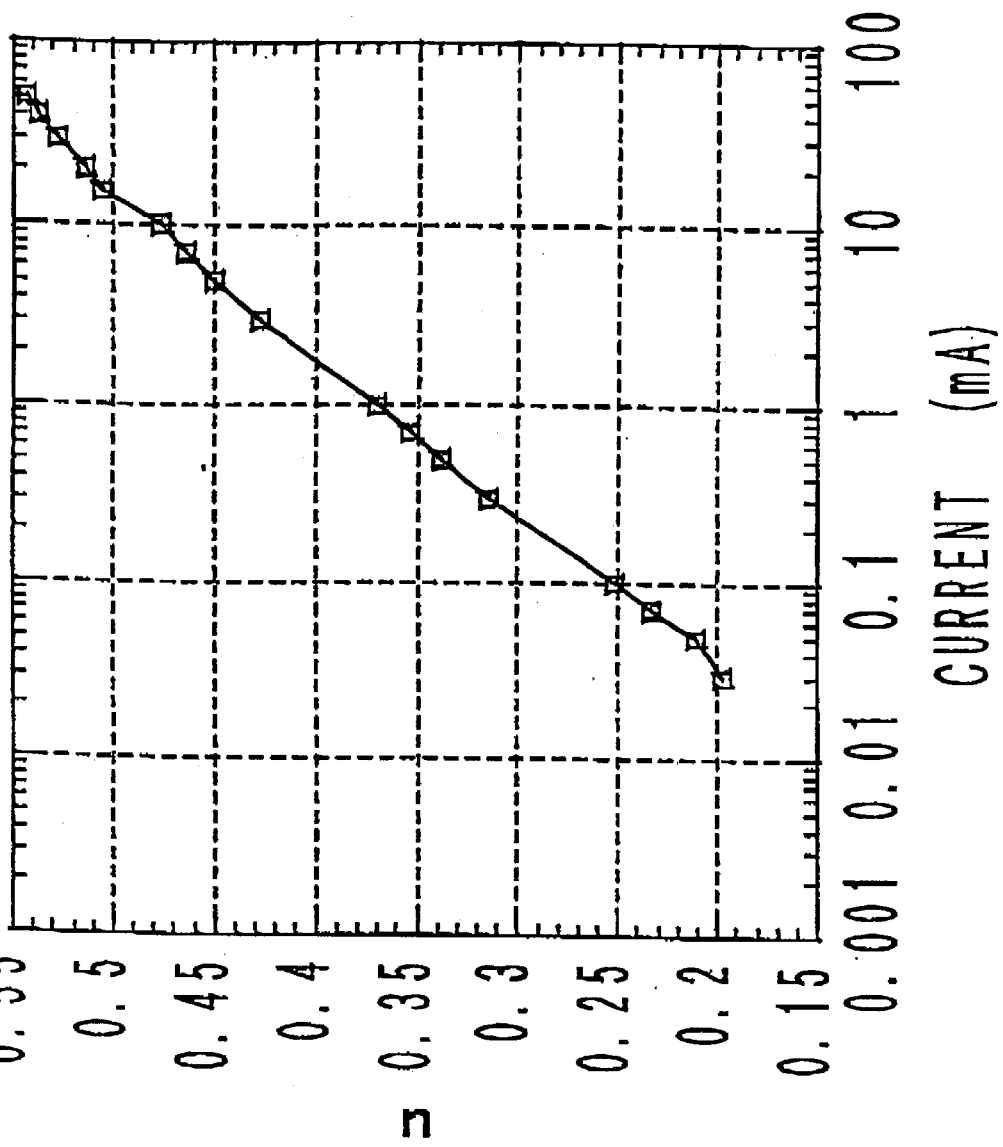
FIG. 16 is a graph showing the u value versus current characteristics of the LED bullet in Example 7.

FIG. 16 is a graph showing the driving current versus chromaticity (u value) characteristics of the LED bullet 164 of Example 7. The u value is a value on the u axis on the USC chromaticity diagram which is determined based on the light color corresponding to the peak wavelength of the emission wavelength spectrum of the LED bullet 164. For the sake of simplicity, the u value is used as a parameter of the light color of the LED bullet 164.

As is seen from the excitation spectrum of a fluorescent shown in FIG. 10, when the excitation wavelength is about 508 nm (0.1 mA), the fluorescent is substantially not excited. As the excitation wavelength becomes shorter toward about 474 nm (30 mA), the fluorescent is more significantly excited. Therefore, the LED bullet 164 is driven at about 0.1 mA, light emitted from the LED device is substantially dominant, so that light emitted from the LED bullet becomes blue.

When the LED device in driven at about 30 mA, light (i.e., red, about 660 nm) emitted from the fluorescent and light (i.e., blue-violet, about 415 nm) emitted from the LED device are mixed. In this case, since the visibility of the light color of the LED device is low, the light (i.e., red light, about 660 nm) of the fluorescent is dominant. Thereby, red is visually recognized.

When the LED device is driven at about 2 mA, the emission of the fluorescent is not very significant and light emitted from the fluorescent is mixed with light (i.e., blue, about 430 nm): emitted from the LED device, so that light emitted from the LED bullet becomes violet.

The light color of the LED bullet when the current value is changed from about 0.1 mA to about 2 mA to about 30 mA is shown with a line indicated by LED BULLET in the UCS chromaticity diagram of Figure. 13.

FIG. 16 is a graph showing the relationship between the current value and the u value. As is seen from FIG. 16, when the driving current is about 0.1 mA, the u value is equal to about $U_{0.25}$, when the driving current is about 1 mA, the u value is equal to about $U_{0.37}$, and when the driving current is about 10 mA, the u value is equal to about $U_{0.475}$.

Figure 15:
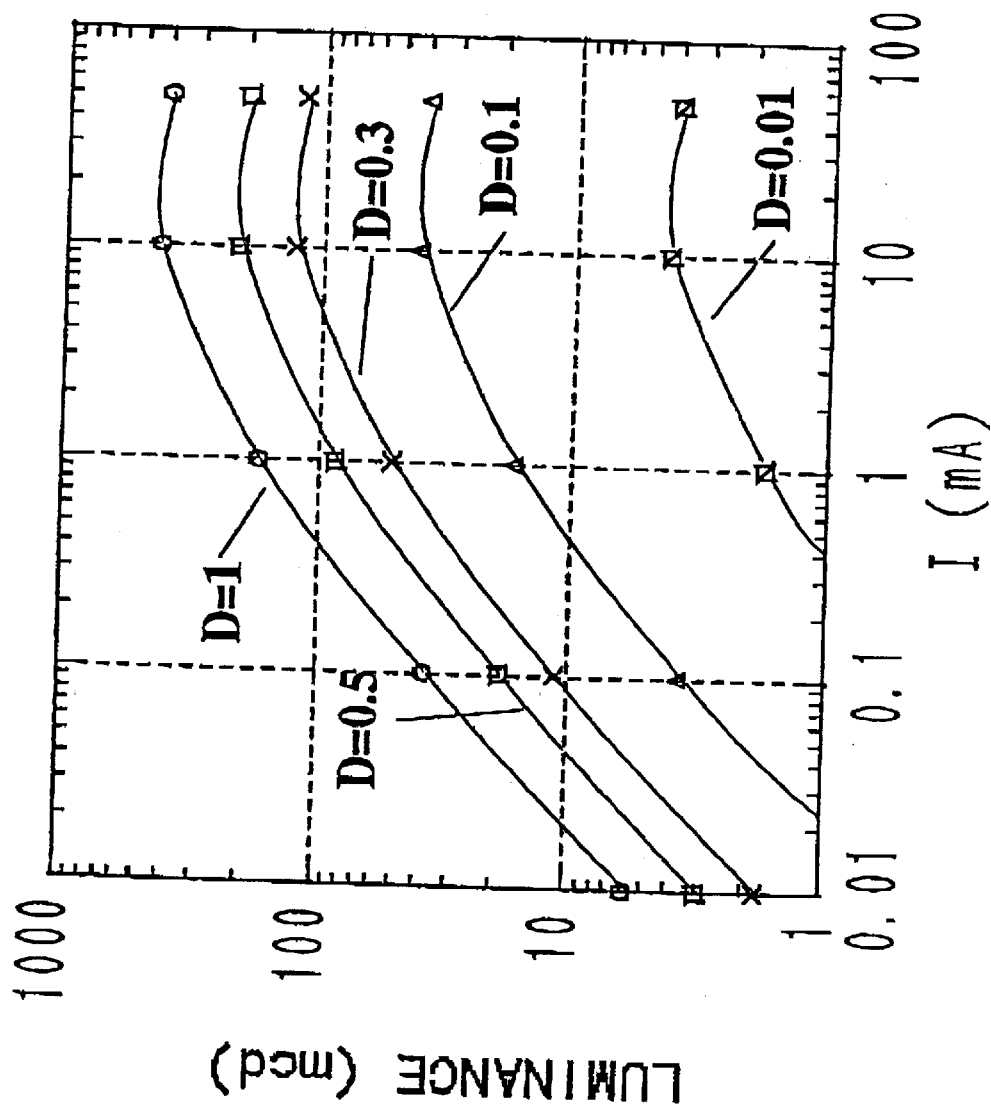
FIG. 15 is a graph showing luminance characteristics of an LED bullet employed in Example 7 of the present invention.

FIG. 15 is a graph showing the luminance characteristics of the LED bullet of Example 7. The horizontal axis represents the current value I of the square wave pulse current R, and the vertical axis represents the luminance (mcd) of the LED bullet. A characteristic curve is shown for each duty D. That is, FIG. 15 is a graph showing the relationship between the luminance L and current value I of the LED bullet of Example 7.

The pulse period $T_2$ 1s not particularly specified, however, It is preferable that a viewer does not sense a flicker. To this end, the period $T_2$ is about 30 ms or less, more preferably about 10 ms or less.

The operation of the LED apparatus and the LED on-off circuit of Example 7 will be described in detail with reference to FIGS. 14, 15, 16, and 17. The LED device having the characteristics shown in FIGS. 15 and 16 is operated so that the u value is equal to $u_{0.37}$ and the emission intensity is equal to about 100 mcd, for example. Thus, luminance is used as a parameter of the emission intensity. The chromaticity signal u (=$u_{0.37}$) and the luminance signal k (=$k_{100}$) designating the luminance (about 100 mcd) of the LED device are externally input to the LED on-off circuit 17.

Initially, the chromaticity signal u is externally input to the chromaticity signal-current value signal converter 162. In this case, the chromaticity signal u is converted to the current value signal i in accordance with the driving current versus chromaticity characteristics shown in FIG. 16. When the chromaticity signal U (=$u_{0.37}$) is input to the converter 162, the converter 162 outputs the current value signal I (=$i_1$) indicating that the designated current value of a pulse to be output by the pulse generator 163 is about 1 mA. This is because the current value versus chromaticity characteristics shown in FIG. 16 indicates a current value of about 1 mA with to a chromaticity of about 0.37. The current value signal i (=$i_1$) is sent to the calculation processor 161 and the pulse generator 163.

The calculation processor 161 receives the luminance signal k and the current value signal i In the calculation processor 161, a duty D is calculated in accordance with the luminance characteristics of the LED bullet shown in FIG. 15. In this case, the luminance signal k is $k_{100}$, and the current value signal i is $i_1$. As can be seen from FIG. 15, the duty D corresponding to the luminance k (=about 100 mod) and $i_1$ (=about 1 mA) is about 0.5. The calculation processor 161 calculates that the duty D is about 0.5, and outputs to the pulse generator 163 a duty signal d (=$d_{0.5}$) indicating that the designated duty D to be output by the pulse generator 163 is about 0.5.

The pulse generator 163 generates and outputs a pulse current R having a current value of about 1 mA and a duty of about 0.5, in accordance with the current value signal i (=$i_1$) sent from the chromaticity signal-current value signal converter 162 and the duty signal d (=$d_{0.5}$) sent from the calculation processor 161, and the LED bullet 164 is driven by the pulse current R to emit light.

In this way, the LED device dependent on the u value of the chromaticity characteristics with respect to the driving current can emit light having the designate luminance and u value on the USC chromaticity diagram.

Further, an LED device (having variations in characteristics in FIGS. 15 and 16) different from the above-described LED devices can be made to emit light having a predetermined luminance and chromaticity as shown in Example 7.

EXAMPLE 8

In Example 8, the LED apparatus of Example 7 is employed. An attempt is made, where the luminance of the LED bullet 164 is temporally changed from about 10 mcd to about 40 mcd to about 100 mcd while the u value of the chromaticity characteristic of the LED device 164 is maintained constant at about 0.37 as in Example 7.

In this case, the chromaticity signal u is maintained constant at $u_{0.37}$, and the luminance signal k is changed from $k_{10}$ to $k_{40}$ to $k_{100}$.

The chromaticity signal-current value signal converter 162 outputs the same current value signal i (=$d_1$) as that described in Example 6.

The duty signal d output from the calculation processor 161 is calculated in a procedure similar to that described, in Example 6. Therefore, as the luminance signal k is changed from $k_{10}$ to $k_{40}$ to $k_{100}$ the duty signal d which is output to the pulse generator 163 is respectively changed from $d_{0.02}$, $d_{0.1}$, and $d_{0.42}$ designating duties D which are equal to about 0.02, about 0.1, and about 0.42, respectively.

As a result, the LED bullet 164 is driven in accordance with the time-varying luminance signals k and the constant chromaticity signal u (note that, in this case, light having a luminance of about 180 mcd or more cannot be obtained).

In Example 8, although the LED device having an emission wavelength (color tone) which is changed with a driving current value is employed, the emission intensity can be solely changed while the emission wavelength (color tone) is maintained constant. Even in LED devices differing from the above-described LED devices in characteristics, the emission intensity may be solely changed while the light color is maintained to be a predetermined color, using a similar method and for similar reasons as those described in Example 1.

When the above-described driving method is applied to a display apparatus in which LED devices having different light colors are simultaneously controlled so as to provide color tones, color shift can be suppressed.

EXAMPLE 9

In Example 9, the LED apparatus of Example 7 is employed. An attempt is made, where the u value of the chromaticity characteristic of the LED bullet 164 is temporally changed from about 0.25 to about 0.37 to about 0.51 while the luminance of the LED device 164 is maintained constant at about 40 mcd.

In this case, the luminance signal k is maintained constant at $k_{40}$, and the chromaticity signal u is changed from $u_{0.25}$ to $u_{0.37}$ to $u_{0.51}$.

The chromaticity signals u (=$u_{0.25}$, $u_{0.37}$, and $u_{0.51}$) are converted by the chromaticity signal-current value signal converter 162 to the current value signals i (=$i_{0.01}$, $i_1$, and $i_{20}$) designating current values of about 0.01 mA, about 1 mA, and about 20 mA, in accordance with FIG. 16 as described in Example 7.

The duty signal d output from the calculation processor 161 is calculated in a procedure similar to that described in Example 7. Therefore, as the current value signals i is changed from $i_{0.01}$ to $i_1$ to $i_{20}$, the duty signal d which is output to the pulse generator 163 is changed from $d_1$, $d_{0.22}$, and $d_{0.1}$, designating duties D which are equal to about 1, about 0.22, and about 0.1, respectively.

As a result, the LED bullet 164 is driven In accordance with the time-varying chromaticity signal u and the constant luminance signals k.

With the driving method of the present invention, the light color of an LED device can be changed without changing the luminance thereof. Thus, when the light color of an LED device is changed using the method of Example 9, a current value is preferably changed by a factor of about 10 or more in order to change a color tone, more preferably by a factor of about 20 or more.

When the above-described driving method is applied to a display apparatus, the u value of the chromaticity characteristic of a single LED device can be changed without changing the luminance thereof. The eyes of a human being can recognize that light having any wavelength has the same brightness, and therefore, significant visual effects can be achieved using a display apparatus having a simple configuration. Further, the light color of the LED device can be continuously changed with ease by continuously changing color signals input to the LED on-off circuit.

In Example 9, an LED bullet in which a fluorescent is excited by an LED device is employed. The light color of the LED bullet can be changed from blue to red without changing the luminance by changing the value of a current supplied to the LED bullet using the LED on-off circuit and the driving method thereof described in Example 1. Such a range of variation in light color is larger than that obtained by a conventional LED apparatus.

In Examples 1 through 9, the driving current supplied to the LED devices is a periodic pulse current. The fundamental period of the driving current is preferably about 30 ms or less, more preferably 10 ns or less, so as to prevent a viewer from sensing a flicker. Further, the pulse duration is about 0.2 ns or more, more preferably 1 ns or more, as described above so that the carrier density can be reliably controlled.

In Examples 1 through 9, the duty is changed while the current value is maintained constant, or the current value is changed while the duty is maintained constant. Nevertheless, the current value or the duty may be changed if the color category of the resultant light color is not substantially changed (plus or minus 3 nm or less of a desired wavelength).

In Examples 5 through 9, a fluorescent may be appropriately selected to obtain the desired excitation spectrum and emission spectrum.

Examples of a fluorescent for emitting red light include ZnS.Cu, LiAlO$_2$: Fe$^{3+}$, Al$_2$O$_3$: Cr, Y$_2$O$_3$: Eu$^{3+}$, Y(P,V)O$_4$:Eu$^{3+}$, Y$_2$O$_3$:Eu, and a combination of Y$_2$O$_3$:Eu and Y$_2$O$_3$: Eu.

Examples of a fluorescent for emitting orange light include ZnS:Cu, Mn, (Zn,Cd)S:Ag, ZnS:Mn, and (Sr,Mg,Ba)$_3$(PO$_4$)$_2$.

Examples of a fluorescent for emitting green light include ZnS:Cu, Al, LaPO$_4$:Ce$^{3+}$Tb$^{3+}$, Sr(S,Se):Sm, Ce, ZnSiO$_4$:Mn$^{2+}$, βZnS:Cu, ZnS:Cu, Fe(Co), ZnS:PbZnS:Cu, and a combination of ZnS:Cu, Al, and Y$_2$Al5O$_{12}$:Tb.

Examples of a fluorescent for emitting blue light include CaS:Bi, (Sr,Ca)$_{10}$(PO$_4$)$_6$Cl$_2$:Eu$_{2+}$, SrS:Sm, Ce, Sr$_2$P$_2$O$_7$:Eu$^{2+}$, βZnS:Ag, (Ba,Ca,Mg)$_{10}$(PO$_4$),Cl:Eu$^{2+}$, and 3Sr$_3$(PO$_4$)$_2$.CaCl$_2$:E$^{2+}$.

Examples of a fluorescent for emitting white light include ZnO:Zn, ZnS:AsZnS:Au, Ag, Al, Ca$_2$P$_2$O,:Dy, Ca$_3$(PO$_4$)$_2$.CaF$_2$:Sb, 3Ca$_3$(PO$_4$)$_2$.Ca(F,Cl)$_2$:Sb$^{3+}$, 3Ca,(PO$_4$)$_2$.Ca(F,Cl)$_2$:Sb$_{3+}$, Mn$^{2+}$, MgWO$_4$, 3Ca,(PO$_4$)$_2$.Ca(F,Cl)$_2$:Sb$^{3+}$, and Mn$^2$.

EXAMPLE 10

Figure 19:
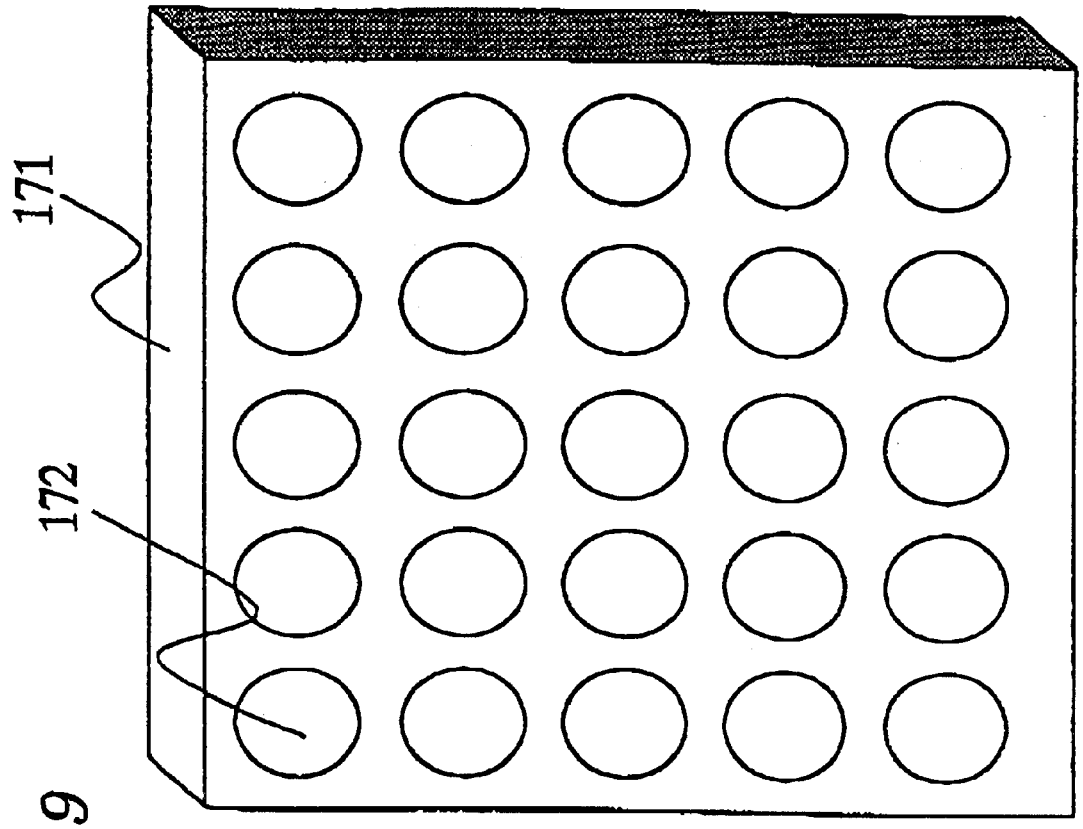
FIG. 19 is a schematic diagram illustrating a display apparatus according to Example 10 of the present invention.
Figure 20:
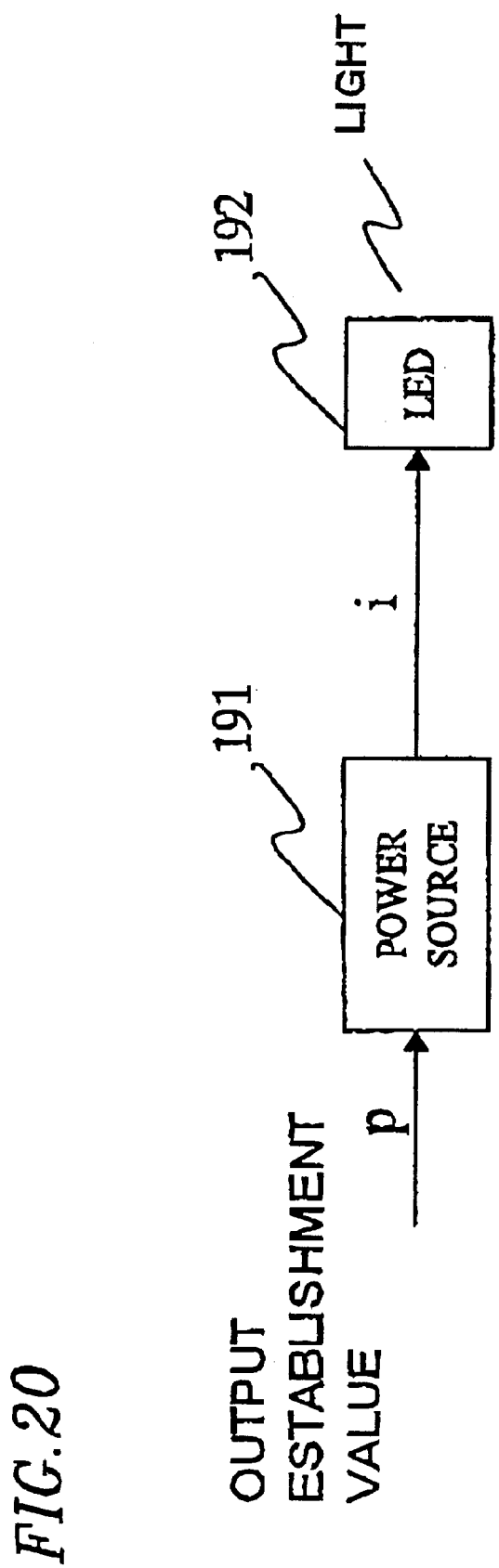
FIG. 20 is a schematic diagram of a conventional LED on-off apparatus.

In Example 10, a display apparatus is obtained using the above-described LED driving method or LED apparatus. FIG. 19 is a schematic diagram illustrating a display employing the above-described LED on-off circuit or LED on-off method. In FIG. 19, the LED on-off circuit of the above-described examples is incorporated into a display 171. Alternatively, the LED on-off circuit maybe separated from the display 171 (i.e., the LED on-off circuit do not need to be incorporated into the display 171).

In FIG. 19, LED devices 172 (or LED bullets) are provided along X and Y directions on a plane so as to form a matrix. When the LED devices 172 are driven by a conventional LED driving circuit, variations in the characteristics of each LED device 172 are significant. Therefore, variations in the color and brightness of light result in a deterioration in the picture quality of the display. In contrast, when the display apparatus shown in FIG. 19 includes the LED apparatus described in Examples 1 through 9 or employs the LED driving method described therein, if the LED devices 172 are driven by the respective LED on-off circuit connected thereto, the LED devices having variations in the characteristics are all allowed to emit-the desired light color and brightness Thereby, the picture quality of an image provided by the display apparatus can be improved.

According to the present invention, an LED S apparatus having a light color which is not changed even if the emission intensity is changed, can be achieved where the light color of an LED device included in the LED apparatus is changed with a change in a driving current value.

A plurality of LED devices which have light colors which are changed with driving current values and which have variations in the characteristics can be driven so that the same emission wavelength and the same emission intensity are obtained. Conventionally, when the LED devices having light colors which are changed with changes In driving current values are employed, the emission wavelengths (i.e., color tones) of the LED devices are different from one another due to variations in characteristics thereof. Such a problem :is solved by the present invention.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A light emitting apparatus comprising:
   a light emitting section for emitting light, a color of the light being blue shifted with a change in value of a driving current; and
   a driving section for driving the light emitting section so that the light emitting section emits light having a desired color and a desired intensity, by generating a pulse current based on a signal designating the desired color and a signal designating the desired intensity and by applying said pulse current to the light emitting section,
   wherein the driving section comprises:
      a converting section for converting the color-designating signal to a signal designating a peak current value in accordance with current versus emission wavelength characteristics of the light emitting section;
      a calculating section for calculating a signal designating a duty ratio based on the intensity-designating signal and the peak current value-designating signal, in such a manner that the product of a peak current value designated by the peak current value-designating signal and a duty ratio corresponds to the intensity designated by the intensity-designating signal; and
      a section for generating, as the driving current, said pulse current having the peak current value and the duty ratio in accordance with the respective current value-designating signal and ratio-designating signal.

2. A light emitting apparatus according to claim 1, wherein the light emitting section is an LED device.

3. A light emitting apparatus according to claim 2, wherein:
   the color-designating signal is a color signal for designating a color of light to be emitted by the LED device; and
   the intensity-designating signal is an intensity signal for designating an intensity of the light to be emitted by the LED device.

4. A light emitting apparatus according to claim 1, wherein the light emitting section is an LED bullet comprising:
   an LED device; and
   a fluorescent excited by light emitted by the LED device to emit light.

5. A light emitting apparatus according to claim 4, wherein when the driving current value is changed, a change in an emission wavelength of the LED bullet is larger than a change in an emission wavelength of the LED device.

6. A light emitting apparatus according to claim 4, wherein:
   the color-designating signal is a chromaticity signal for designating a color of light to be emitted by the LED bullet; and
   the intensity-designating signal is the luminance signal for designating an intensity of the light to be emitted by the LED bullet.

7. A light emitting apparatus according to claim 1, comprising:
   a plurality of the light emitting sections; and
   a plurality of the driving sections respectively corresponding to the plurality of the light emitting sections,
      wherein a color and intensity of light emitted by each of the plurality of the light emitting sections is controlled by a corresponding one of the plurality of the driving sections.

8. A light emitting apparatus comprising:
   a light emitting section for emitting light, a color of the light being blue shifted with a change in value of a driving current; and
   a driving section for driving the light emitting section so that the light emitting section emits light having a desired color and a desired intensity, by generating a pulse current based on a signal designating the desired color and a signal designating the desired intensity and by applying the said pulse current to the light emitting section,
   wherein the light emitting section is an LED device, and the LED device comprises:
      an InGaN active layer; and
      an AlGaN layer having two layers, provided on the InGaN active layer,
      wherein one of the two layers is a first AlGaN layer contracting the InGaN active layer, and the other of the two layers of the AlGaN layer is a second AlGaN layer provided on the first AlGaN layer,
      the first AlGaN layer is produced at substantially the same growth temperature as the InGaN active layer, and
      the second AlGaN layer is produced at a growth temperature higher than the growth temperature of the first AlGaN layer.

9. A light emitting apparatus comprising:
   a light emitting section for emitting light, a color of the light being blue shifted with a change in value of a driving current; and
   a driving section for driving the light emitting section so that the light emitting section emits light having a desired color and a desired intensity, by generating a pulse current based on a signal designating the desired color and a signal designating the desired intensity and by applying said pulse current to the light emitting section,
   wherein the light emitting section is an LED bullet comprising:
      an LED device; and
      a fluorescent excited by light emitted by the LED device to emit light, wherein the LED device comprises:
         an InGaN active layer; and
         an AlGaN layer having two layers, provided on the InGaN active layer,
         wherein one of the two layers is a first AlGaN layer contracting the InGaN active layer, and the other of the two layers of the AlGaN layer is a second AlGaN layer provided on the first AlGaN layer,
         the first AlGaN layer is produced at substantially the same growth temperature as the InGaN active layer, and
         the second AlGaN layer is produced at a growth temperature higher than the growth temperature of the first AlGaN layer.

10. A method for driving a light emitting apparatus, the apparatus comprising:
   a light emitting section for emitting light, a color of the light being blue shifted with a change in value of a driving current; and
   a driving section for driving the light emitting section, and
   the method comprising the steps of:
      receiving a signal designating a desired color and a signal designating a desired intensity;
      generating a pulse current based on the color-designating signal and the intensity-designating signal; and
      applying said pulse current to the light emitting section so that the light emitting section emits light having the desired color and the desired intensity;
      converting the color-designating signal to a signal designating a peak current value in accordance with current value in accordance with current versus emission wavelength characteristics of the light emitting section;
      calculating a signal designating a duty ratio based on the intensity-signal and the peak current value-designating signal, in such a manner that the product of a peak current value designated by the peak current value-designating signal and the duty corresponds to the intensity designated by the intensity-designating signal; and
      generating as the driving current a pulse current having the peak current value and the duty ratio in accordance with the respective peak current value-designating signal and duty ratio-designating signal.

11. A method for driving a light emitting apparatus according to claim 10, wherein the light emitting section is an LED device.

12. A method for driving a light emitting apparatus according to claim 11, wherein:
   the color-designating signal is a color signal for designating a color of light to be emitted by the LED device; and
   the intensity-designating signal is an intensity signal for designating and intensity of the light to be emitted by the LED device.

13. A method for driving a light emitting apparatus according to claim 11, wherein;
   the peak current value is controlled so that the emission wavelength of the LED device is changed; and
   the duty ratio is controlled so that the emission intensity of the LED device is substantially maintained constant.

14. A method for driving a light emitting apparatus according to claim 10, wherein the light emitting section is an LED bullet comprising:
   an LED device; and
   a fluorescent excited by light emitted by the LED device to emit light.

15. A method for driving a light emitting apparatus according to claim 14, wherein when the driving current value is changed, a change in an emission wavelength of the LED bullet is larger than a change in an emission wavelength of the LED device.

16. A method for driving a light emitting apparatus according to claim 14, wherein:
   the color-designating signal is a chromaticity signal for designating a color of light to be emitted by the LED bullet; and
   the intensity-designating signal is a luminance signal for designating an intensity of the light to be emitted by the LED bullet.

17. A method for driving a light emitting apparatus according to claim 10, the light emitting apparatus comprising:
   a plurality of the light emitting sections; and
   a plurality of the driving sections respectively corresponding to the plurality of the light emitting sections,
   wherein the color and intensity of light emitted by each of the plurality of the light emitting sections is controlled by a corresponding one of the plurality of the driving sections.

18. A method for driving a light emitting apparatus, the apparatus comprising:
   a light emitting section for emitting light, a color of the light being blue shifted with a change in value of a driving current; and
   a driving section for driving the light emitting section wherein the light emitting section is an LED device comprising:
      an InGaN active layer; and
      an AlGaN layer having two layers, provided on the InGaN active layer,
      wherein one of the two layers is a first AlGaN layer contracting the InGaN active layer, and the other of the two layers of the AlGaN layer is a second AlGaN layer provided on the first AlGaN layer,
      the first AlGaN layer is produced at substantially the same growth temperature as the InGaN active layer, and
      the second AlGaN layer is produced at a growth temperature higher than the growth temperature of the first AlGaN layer; and
      the method comprising the steps of:
         receiving a signal designating a desired color and a signal designating a desired intensity;
         generating a pulse current based on the color-designating signal and the intensity designating signal;
         applying said pulse current to the light emitting section so that the light emitting section emits light having the desired color and the desired intensity.

19. A method for driving a light emitting apparatus, the apparatus comprising:
   a light emitting section for emitting light, a color of the light being blue shifted with a change in a driving current; and
   a driving section for driving the light emitting section wherein the light emitting section is an LED bullet comprising:
      an LED device;
      a fluorescent excited by light emitted by the LED device to emit light;
      an InGaN active layer; and
      an AlGaN layer having two layers, provided on the InGaN active layer,
      wherein one of the two layers is a first AlGaN layer contracting the InGaN active layer, and the other of the two layers of the AlGaN layer is a second AlGaN layer provided on the first AlGaN layer,
      the first AlGaN layer is produced at substantially the same growth temperature as the InGaN active layer, and
      the second AlGaN layer is produced at a growth temperature higher than the growth temperature of the first AlGaN layer; and
      the method comprising the steps of:
         receiving a signal designating a desired color and a signal designating a desired intensity;
         generating a pulse current based on the color-designating signal and the intensity-designating signal;
         applying said pulse current to the light emitting section so that the light emitting section emits light having the desired color and the desired intensity.

20. A display apparatus comprising:
   a plurality of light emitting sections provided in a plane, light emitted by each of the plurality of light emitting sections being blue shifted with a change in value of a driving current; and
   a plurality of driving sections each for driving a corresponding one of the plurality of light emitting sections so that the corresponding one of the plurality of light emitting sections emits light having a desired color and a desired intensity, by each generating a pulse current based on a signal designating the desired color and a signal designating the desired intensity and by each applying the driving current to the corresponding one of the plurality of light emitting sections, wherein the color and intensity of the respective light emitting section are controlled in accordance with a characteristics between a current value and an emitting color of the light emitting section
   wherein each driving section comprises:
      a converting section for converting the color-designating signal for that driving section to a signal designating a peak current value in accordance with current versus emission wavelength characteristics of the corresponding light emitting section:
      a calculating section for calculating a signal designating a duty ratio based on the intensity-designating signal for that driving section and the peak current value-designating signal for that driving section, in such a manner that the product of a peak current value designated by the peak current value-designating signal and a duty ratio corresponds to the intensity designated by the intensity-designating signal; and
      a section for generating, as the driving current for that driving section, said pulse current having the peak current value and the duty ratio in accordance with the respective current value-designating signal and ratio-designating signal.

21. A display apparatus according to claim 20, wherein each of the plurality of light emitting sections is an LED device.

22. A display apparatus according to claim 20, wherein each of the plurality of light emitting sections is an LED bullet comprising:

an LED device; and a fluorescent excited by light emitted by the LED device to emit light.

* * * * *